United States Patent
Tanada et al.

(10) Patent No.: US 8,928,011 B2
(45) Date of Patent: Jan. 6, 2015

(54) LIGHT-EMITTING DEVICE AND LIGHTING DEVICE

(75) Inventors: Yoshifumi Tanada, Tochigi (JP); Hidenori Mori, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 41 days.

(21) Appl. No.: 13/409,814

(22) Filed: Mar. 1, 2012

(65) Prior Publication Data
US 2012/0223342 A1  Sep. 6, 2012

(30) Foreign Application Priority Data

Mar. 2, 2011  (JP) ................. 2011-045541

(51) Int. Cl.
*H01L 29/18* (2006.01)
*H01L 27/32* (2006.01)
*H01L 51/52* (2006.01)

(52) U.S. Cl.
CPC ........ *H01L 27/3204* (2013.01); *H01L 51/5212* (2013.01); *H01L 51/5228* (2013.01); *H01L 2251/5361* (2013.01)
USPC .................. 257/88; 257/98; 257/99; 257/347; 438/735; 313/498; 313/503; 313/504

(58) Field of Classification Search
CPC ............ H01L 51/56; H01L 2251/5361; H01L 27/3244; H01L 27/3204; H01L 27/3281; H01L 51/5012
USPC ......... 257/88, 98, 99, 347; 438/725; 313/498, 313/503–504
See application file for complete search history.

(56) References Cited

U.S. PATENT DOCUMENTS

| | | | | |
|---|---|---|---|---|
| 5,701,055 A * | 12/1997 | Nagayama et al. | ........... | 313/504 |
| 5,773,931 A * | 6/1998 | Shi et al. | ........... | 313/509 |
| 6,037,712 A * | 3/2000 | Codama et al. | ........... | 313/498 |
| 6,133,581 A | 10/2000 | Terao et al. | | |
| 6,222,315 B1 | 4/2001 | Yoshizawa et al. | | |
| 6,249,084 B1 * | 6/2001 | Yamana | ........... | 313/504 |
| 6,280,861 B1 | 8/2001 | Hosokawa et al. | | |
| 6,306,559 B1 * | 10/2001 | Tanamura et al. | ........... | 430/315 |
| 6,538,374 B2 * | 3/2003 | Hosokawa | ........... | 313/504 |
| 7,161,184 B2 | 1/2007 | Miyagi et al. | | |
| 7,633,218 B2 * | 12/2009 | Cok | ........... | 313/503 |

(Continued)

FOREIGN PATENT DOCUMENTS

| | | |
|---|---|---|
| JP | 2005-235491 | 9/2005 |
| JP | 2006-49853 | 2/2006 |

(Continued)

*Primary Examiner* — Fernando L Toledo
*Assistant Examiner* — Mohammed Shamsuzzaman
(74) *Attorney, Agent, or Firm* — Husch Blackwell LLP

(57) ABSTRACT

A highly reliable light-emitting device or lighting device is provided. Further, a light-emitting device or lighting device with a high manufacturing yield is provided. Provided is a light-emitting device having a contact structure which includes a separation layer having a shape typified by a reverse tapered shape in which an outline of the bottom portion is inside an outline of an upper portion and which utilizes the difference between an amount of a light-emitting layer extending inside the outline and that of an upper electrode extending inside the outline. Further, when the outline of the separation layer which forms the contact portion has a depression and a projection, the length of the contact portion can be increased, and thus, contact resistance can be reduced.

11 Claims, 11 Drawing Sheets

(56) References Cited

U.S. PATENT DOCUMENTS

| | | |
|---|---|---|
| 7,834,543 B2 | 11/2010 | Takata |
| 7,888,864 B2 | 2/2011 | Young |
| 7,923,779 B2 * | 4/2011 | Yamazaki et al. .............. 257/347 |
| 7,943,938 B2 | 5/2011 | Miyagi et al. |
| 7,999,463 B2 | 8/2011 | Nomura |
| 2003/0060055 A1 * | 3/2003 | Kamijima ..................... 438/725 |
| 2004/0245921 A1 * | 12/2004 | Lu et al. ......................... 313/504 |
| 2005/0116625 A1 * | 6/2005 | Park et al. ...................... 313/504 |
| 2005/0116632 A1 * | 6/2005 | Funamoto et al. ............. 313/506 |
| 2006/0220544 A1 | 10/2006 | Okuyama et al. |
| 2008/0079352 A1 * | 4/2008 | Cok ............................... 313/503 |
| 2008/0116788 A1 * | 5/2008 | Yamazaki et al. ............. 313/504 |
| 2008/0224606 A1 | 9/2008 | Kawai et al. |
| 2008/0286445 A1 * | 11/2008 | Suzuki et al. ................... 427/64 |
| 2009/0009069 A1 * | 1/2009 | Takata ........................... 313/504 |
| 2009/0058278 A1 | 3/2009 | Ushikubo et al. |
| 2009/0153046 A1 | 6/2009 | Hayashi et al. |
| 2009/0295284 A1 * | 12/2009 | Park et al. ..................... 313/504 |
| 2010/0301326 A1 | 12/2010 | Miyairi et al. |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0210335 A1 | 9/2011 | Miyagi et al. |
| 2012/0161165 A1 | 6/2012 | Yamazaki |
| 2012/0161166 A1 | 6/2012 | Yamazaki |
| 2012/0161167 A1 * | 6/2012 | Yamazaki ....................... 257/88 |
| 2012/0161174 A1 | 6/2012 | Yamazaki |
| 2012/0205678 A1 * | 8/2012 | Ikeda et al. ..................... 257/88 |
| 2012/0205700 A1 * | 8/2012 | Tanada et al. ................... 257/98 |
| 2012/0223342 A1 * | 9/2012 | Tanada et al. ................... 257/88 |
| 2012/0248489 A1 * | 10/2012 | Yoshizumi et al. ............. 257/99 |

FOREIGN PATENT DOCUMENTS

| | | |
|---|---|---|
| JP | 2008-135325 | 6/2008 |
| JP | 2009-32673 | 2/2009 |
| JP | 2009-130132 | 6/2009 |
| JP | 2009-266803 | 11/2009 |
| WO | WO 2004/044987 A2 | 5/2004 |

* cited by examiner

LIGHT-EMITTING DEVICE AND LIGHTING DEVICE

BACKGROUND OF THE INVENTION

1. Field of the Invention

The present invention relates to a light-emitting device or a lighting device including an EL element in which a light-emitting layer containing an organic compound is interposed between a pair of electrodes.

2. Description of the Related Art

In recent years, a light-emitting element (also referred to as an electroluminescent (EL) element) in which a light-emitting layer (hereinafter also referred to as an EL layer) containing an organic compound is interposed between a pair of electrodes has been actively developed. Lighting has attracted attention as one of application fields of the light-emitting element. This is because a lighting device including the EL element has features different from those of other lighting devices; for example, the lighting device including the EL element can be thin and light, and perform surface emission.

In addition, an EL element has attracted attention also in terms of its high efficiency of conversion from power into light and its high potential for saving energy. It is also a unique feature of an EL element that, depending on a substrate selected, it is possible to provide a lighting device having flexibility, a lighting device having high resistance against an impact such as physical destruction, or a very lightweight lighting device.

A lighting device including an organic EL element is disclosed in Patent Document 1.

REFERENCE

Patent Document

[Patent Document 1] Japanese Published Patent Application No. 2009-130132

SUMMARY OF THE INVENTION

In the case where an EL element having a plurality of light-emitting regions or a plurality of EL elements is formed over a substrate, at least one of electrodes needs to be patterned into a desired shape. In order to perform patterning on an electrode on a substrate side of a pair of electrodes, a photolithography technique can be used. On the other hand, when patterning is performed on the other electrode, the patterning is performed after a light-emitting layer containing an organic compound is formed; therefore, it is extremely difficult to use a photolithography technique utilizing a solvent.

In that case, patterning with the use of a metal mask (shadow mask) is generally performed. In this method, patterning is performed in such a manner that a metal mask is provided between a substrate and a material source and deposition is performed on the substrate through an opening portion in the metal mask.

However, a metal mask is much inferior in alignment accuracy and patterning accuracy to a photomask used in a photolithography step. Accordingly, a sufficient space is required around a deposition region in performing selective deposition with the use of a metal mask. In other words, area loss in patterning with the use of a metal mask is much larger than that in patterning in a photolithography step. Therefore, a lighting device manufactured using a metal mask has a small light-emitting region because of the area loss. In order to obtain desired luminance, a lighting device with a small light-emitting region requires larger current than a lighting device with a large light-emitting region. However, degradation is accelerated due to large current, and thus, the lifetime might be adversely affected. Further, the shorter the distance between a metal mask and a substrate is, the more accurately a pattern can be formed; however, a light-emitting layer or the like which has already been formed might be damaged in the case where the metal mask is so close to the substrate as to be in contact with a surface of the substrate. In addition, dust or the like attached to the metal mask might be attached to the substrate in some cases. Damage of a light-emitting layer, attachment of dust, or the like causes defects such as a short circuit and formation of a non-light-emitting region, leading to a decrease in reliability and manufacturing yield.

In view of the foregoing, an object of an embodiment of the present invention is to provide a light-emitting device or a lighting device with high reliability. Further, an object is to provide a light-emitting device or a lighting device with a high manufacturing yield.

Low power consumption can be a great advantage for a lighting device. Therefore, an object of an embodiment of the present invention is to provide a light-emitting device or a lighting device with reduced contact resistance and lower power consumption, which can achieve at least one of the above objects.

The present invention achieves at least one of the above-stated objects.

In view of the foregoing, the present inventors have found a light-emitting device having a contact structure, in which a separation layer having a shape typified by a reverse tapered shape in which an outline of the bottom portion is inside an outline of the upper portion is included, and in which the difference between an amount of a light-emitting layer extending inside the outline of the upper portion of the separation layer and that of an upper electrode extending inside the outline of the upper portion of the separation layer is utilized. Further, the present inventors have found that the length of a contactable portion can be increased when an outline of the separation layer forming the contact structure includes a depression and a projection, and thus, contact resistance can be reduced.

In other words, an embodiment of the present invention is a light-emitting device including a light-emitting element formed over an insulating surface. The light-emitting element includes a first electrode on the insulating surface, a second electrode which faces the first electrode, and an organic compound layer containing a light-emitting substance between the first electrode and the second electrode. A light-emitting region is formed in a portion where the first electrode, the organic compound layer, and the second electrode are stacked in contact with one another. The light-emitting device further includes a separation layer with a protruding upper portion which protrudes outside more than a bottom portion along a side of the light-emitting region. A conductive layer which is electrically isolated from the first electrode is provided below the separation layer. The organic compound layer and the second electrode in the light-emitting region extend to a space under the protruding portion of the separation layer, and the second electrode extends more on the inside of an outline of the protruding portion than the organic compound layer. Thus, the second electrode is electrically connected to the conductive layer. The sum of the length of outlines, which faces the light-emitting region, of the protruding portion of the separation layer is larger than the sum of the length of sides, which face the separation layer, of the light-emitting region.

Another embodiment of the present invention is a light-emitting device including a light-emitting element formed over an insulating surface. The light-emitting element includes a first electrode on the insulating surface, a second electrode which faces the first electrode, and an organic compound layer containing a light-emitting substance between the first electrode and the second electrode. A light-emitting region is formed in a portion where the first electrode, the organic compound layer, and the second electrode are stacked in contact with one another. The light-emitting device further includes a plurality of separation layers each with a protruding upper portion which protrudes outside more than a bottom portion along a side of the light-emitting region. A conductive layer which is electrically isolated from the first electrode is provided below the separation layers. The organic compound layer and the second electrode in the light-emitting region extend to a space under the protruding portion of the plurality of separation layers, and the second electrode extends more on the inside of an outline of the protruding portion than the organic compound layer. Thus, the second electrode is electrically connected to the conductive layer. The sum of the length of outlines of the protruding portions of the plurality of separation layers is larger than the sum of the length of sides, which face the separation layers, of the light-emitting region.

The light-emitting device according to an embodiment of the present invention, which has such a structure, is highly reliable because the second electrode can be patterned without a metal mask. For the same reason, the light-emitting device can be manufactured with high yield. Further, the conductive layer which is electrically isolated from the first electrode is in contact with the second electrode, so that the conductive layer serves as an auxiliary wiring of the second electrode. Thus, a voltage drop of the second electrode can be suppressed and a light-emitting device with high quality can be provided. Furthermore, since the length of a portion where the second electrode and the conductive layer are in contact with each other is long, a light-emitting device with lower contact resistance and low power consumption can be provided. Since a contact portion is formed in accordance with the length of the outline of the separation layer, in the case where the separation layer is divided into a plurality of island-shaped separation layers, contact resistance can be reduced when the sum of the length of the outlines of the plurality of separation layers is larger than the sum of the length of sides facing the separation layer in the light-emitting region.

Further, another embodiment of the present invention is a light-emitting device including a light-emitting element formed over an insulating surface. The light-emitting element includes a first electrode on the insulating surface, a second electrode which faces the first electrode, and an organic compound layer containing a light-emitting substance between the first electrode and the second electrode. A light-emitting region is formed in a portion where the first electrode, the organic compound layer, and the second electrode are stacked in contact with one another. The light-emitting device further includes a separation layer in a region between the light-emitting regions. In the separation layer, a leg portion is formed inside an outline of the separation layer seen from a direction perpendicular to the insulating surface. A conductive layer which is electrically isolated from the first electrode is provided below the separation layer. The second electrode and the conductive layer are in contact with each other in a portion inside the outline of the separation layer seen from the direction perpendicular to the insulating surface. When seen from the direction perpendicular to the insulating surface, the length of the outline of the separation layer is longer than the sum of the length of sides of the smallest quadrilateral which can cover the separation layer.

Further, another embodiment of the present invention is a light-emitting device including a light-emitting element formed over an insulating surface. The light-emitting element includes a first electrode on the insulating surface, a second electrode which faces the first electrode, and an organic compound layer containing a light-emitting substance between the first electrode and the second electrode. A light-emitting region is formed in a portion where the first electrode, the organic compound layer, and the second electrode are stacked in contact with one another. The light-emitting device further includes a plurality of separation layers in a region between the light-emitting regions. In each of the plurality of separation layers, a leg portion is formed inside an outline of the separation layer seen from a direction perpendicular to the insulating surface. A conductive layer which is electrically isolated from the first electrode is provided below the plurality of separation layers. The second electrode and the conductive layer are in contact with each other inside the outline of each of the plurality of separation layers seen from the direction perpendicular to the insulating surface. When seen from the direction perpendicular to the insulating surface, the sum of the length of the outlines of the plurality of separation layers is larger than the sum of the length of sides of the smallest quadrilateral which can cover the plurality of separation layers.

The light-emitting device according to an embodiment of the present invention, which has such a structure, is highly reliable because the second electrode can be patterned without a metal mask. For the same reason, the light-emitting device can be manufactured with high yield. Further, the conductive layer which is electrically isolated from the first electrode is in contact with the second electrode, so that the conductive layer functions as an auxiliary wiring of the second electrode. Thus, a voltage drop of the second electrode can be suppressed and a light-emitting device with high quality can be provided. Furthermore, since the length of a portion where the second electrode and the conductive layer are in contact with each other is long, a light-emitting device with lower contact resistance and low power consumption can be provided. Since the contact portion is formed in accordance with the length of the outline of the separation layer, in the case where the separation layer is divided into a plurality of island-shaped separation layers, contact resistance can be reduced when the sum of the length of the outlines of the plurality of separation layers is larger than the sum of the length of sides of the smallest quadrilateral which can cover the plurality of separation layers.

Another embodiment of the present invention is a light-emitting device with the above structure, in which the second electrode is formed using a light-transmitting material.

The light-emitting device according to an embodiment of the present invention, which has such a structure, can be a top-emission light-emitting device. As compared to a bottom-emission light-emitting device, the top-emission light-emitting device can release heat easily; thus, the top-emission light-emitting device can be highly reliable. Further, a light-transmitting material has low electrical conductivity in general and luminance unevenness might be generated in a light-emitting region due to a voltage drop depending on the thickness and the shape of the electrode. However, when a conductive layer is used for an auxiliary electrode, generation of the luminance unevenness can be suppressed.

Further, another embodiment of the present invention is a light-emitting device with the above structure, in which the conductive layer is formed using the same material as the first electrode.

In the light-emitting device according to an embodiment of the present invention, which has the above structure, the conductive layer and the first electrode can be formed concurrently; thus, the above structure can be achieved easily.

Another embodiment of the present invention is a light-emitting device including a first light-emitting element and a second light-emitting element over an insulating surface. The first light-emitting element includes a first electrode positioned on the insulating surface side, a second electrode which faces the first electrode, and an organic compound layer containing a light-emitting substance between the first electrode and the second electrode. The second light-emitting element includes a third electrode positioned on the insulating surface side, a fourth electrode which faces the third electrode, and an organic compound layer containing a light-emitting substance between the third electrode and the fourth electrode. The light-emitting device further includes a separation layer in a region between the first light-emitting element and the second light-emitting element. A wiring which is electrically connected to the third electrode is formed below the separation layer. The separation layer includes a protruding upper portion which protrudes outside more than a bottom portion. The organic compound layer and the second electrode in the first light-emitting element extend to a space under the protruding portion of the separation layer and the second electrode extends more on the inside of an outline of the protruding portion than the organic compound layer, so that the second electrode is in contact with the wiring. The length of a portion where the second electrode and the wiring are in contact with each other is longer than the length of a side, which faces the separation layer, of the first light-emitting element.

In the light-emitting device having the above structure, the first light-emitting element and the second light-emitting element are connected to each other in series. Further, a contact portion for the series connection can be formed without a photolithography step after formation of the light-emitting layer and a metal mask, so that a highly reliable light-emitting device can be provided. Further, the light-emitting device can be manufactured with high yield. Furthermore, the length of the contact portion for the series connection is longer than the length of the side facing the separation layer in the first light-emitting element, so that contact resistance can be reduced and thus a light-emitting device having low power consumption can be provided.

Another embodiment of the present invention is a light-emitting device including a first light-emitting element and a second light-emitting element over an insulating surface. The first light-emitting element includes a first electrode positioned on the insulating surface side, a second electrode which faces the first electrode, and an organic compound layer containing a light-emitting substance between the first electrode and the second electrode. The second light-emitting element includes a third electrode positioned on the insulating surface side, a fourth electrode which faces the third electrode, and an organic compound layer containing a light-emitting substance between the third electrode and the fourth electrode. The light-emitting device further includes a plurality of separation layers in a region between the first light-emitting element and the second light-emitting element. A wiring which is electrically connected to the third electrode is formed below the plurality of separation layers. Each of the plurality of separation layers includes a protruding upper portion which protrudes outside more than a bottom portion. The organic compound layer and the second electrode in the first light-emitting element extend to a space under the protruding portions of the plurality of separation layers and the second electrode extends more on the inside of an outline of the protruding portion than the organic compound layer, so that the second electrode is in contact with the wiring. The length of a portion where the second electrode and the wiring are in contact with each other is longer than the length of a side facing the plurality of separation layers in the first light-emitting element.

In the light-emitting device having the above structure, the first light-emitting element and the second light-emitting element are connected to each other in series. Further, a contact portion for the series connection can be formed without a photolithography step after formation of the light-emitting layer and a metal mask, so that a highly reliable light-emitting device can be provided. Further, the light-emitting device can be manufactured with high yield. Furthermore, the length of the contact portion for the series connection is longer than the length of the side of the smallest quadrilateral which can cover the separation layer, so that contact resistance can be reduced and thus a light-emitting device having low power consumption can be provided. Since the contact portion is formed in accordance with the length of the outline of the separation layer, in the case where the separation layer is divided into a plurality of island-shaped separation layers, contact resistance can be reduced when the sum of the length of the outlines of the plurality of separation layers is larger than the length of the side facing the separation layers in the first light-emitting element.

Another embodiment of the present invention is a light-emitting device including a first light-emitting element and a second light-emitting element over an insulating surface. The first light-emitting element includes a first electrode positioned on the insulating surface side, a second electrode which faces the first electrode, and an organic compound layer containing a light-emitting substance provided between the first electrode and the second electrode. The second light-emitting element includes a third electrode positioned on the insulating surface side, a fourth electrode which faces the third electrode, and an organic compound layer containing a light-emitting substance provided between the third electrode and the fourth electrode. The light-emitting device further includes a separation layer in a region between the first light-emitting element and the second light-emitting element. In the separation layer, a leg portion is formed inside an outline of the separation layer seen from a direction perpendicular to the insulating surface. A wiring which is electrically connected to the third electrode is formed below the separation layer. An insulating layer overlapping with a portion of the outline facing the second light-emitting element and with part inside the outline is formed over the wiring. The second electrode and the wiring are in contact with each other in a region inside the outline, where the insulating layer does not exist. When seen from the direction perpendicular to the insulating surface, the length of a portion, which does not overlap with the insulating layer, of the outline is longer than the length of a portion, which does not overlap with the insulating layer, of a side of the smallest quadrilateral which can cover the separation layer.

In the light-emitting device having the above structure, the first light-emitting element and the second light-emitting element are connected to each other in series. Further, a contact portion for the series connection can be formed without a photolithography step after formation of the light-emitting layer and a metal mask, so that a highly reliable light-emitting device can be provided. Further, the light-emitting device can be manufactured with high yield. Furthermore, the length of the contact portion for the series connection is longer than the length of a side, which corresponds to the contact portion, of the smallest quadrilateral which can cover the separation layer, so that contact resistance can be reduced and thus a light-emitting device having low power consumption can be provided.

Another embodiment of the present invention is a light-emitting device including a first light-emitting element and a second light-emitting element over an insulating surface. The first light-emitting element includes a first electrode positioned on the insulating surface side, a second electrode which faces the first electrode, and an organic compound layer containing a light-emitting substance between the first electrode and the second electrode. The second light-emitting element includes a third electrode positioned on the insulating surface side, a fourth electrode which faces the third electrode, and an organic compound layer containing a light-emitting substance between the third electrode and the fourth electrode. The light-emitting device further includes a plurality of separation layers in a region between the first light-emitting element and the second light-emitting element. In each of the plurality of separation layers, a leg portion is formed inside an outline of the separation layer seen from a direction perpendicular to the insulating surface. A wiring which is electrically connected to the third electrode is formed below the plurality of separation layers. An insulating layer overlapping with a portion of the outlines of the plurality of separation layers facing the second light-emitting element and with part inside the outline is provided over the wiring. The second electrode and the wiring are in contact with each other in a region inside the outlines of the plurality of separation layers, where the insulating layer does not exist. When seen from the direction perpendicular to the insulating surface, the sum of the length of portions, which do not overlap with the insulating layer, of the outlines of the plurality of separation layers is larger than the length of portions, which do not overlap with the insulating layer, of sides of the smallest quadrilateral which can cover the plurality of separation layers.

In the light-emitting device having the above structure, the first EL element and the second EL element are connected to each other in series. Further, a contact portion for the series connection can be formed without a photolithography step after formation of the light-emitting layer and a metal mask, so that a highly reliable light-emitting device can be provided. Further, the light-emitting device can be manufactured with high yield. Furthermore, the length of the contact portion for the series connection is longer than the length of a side of the smallest quadrilateral which can cover the separation layer, so that contact resistance can be reduced and thus a light-emitting device having low power consumption can be provided. Since the contact portion is formed in accordance with the length of the outline of the separation layer, in the case where a plurality of island-shaped separation layers is included, contact resistance can be reduced when the sum of the length of the outlines of the plurality of separation layers is larger than the sum of the length of sides of the smallest quadrilateral which can cover the plurality of separation layers.

Another embodiment of the present invention is a light-emitting device having the above structure, in which the second electrode and the fourth electrode are each formed using a light-transmitting material.

The light-emitting device according to an embodiment of the present invention, which has such a structure, can be a top-emission light-emitting device. As compared to a bottom-emission light-emitting device, the top-emission light-emitting device can release heat easily; thus, the top-emission light-emitting device can be highly reliable. Further, a light-transmitting material has low electrical conductivity in general and luminance unevenness might be generated in a light-emitting region due to a voltage drop depending on the thickness and the shape of the electrode. However, when a conductive layer is used for an auxiliary electrode, generation of the luminance unevenness can be suppressed.

Another embodiment of the present invention is a light-emitting device with the above structure, in which the wiring is not disconnected from the third electrode.

In the light-emitting device according to an embodiment of the present invention, which has the above structure, the conductive layer and the first electrode can be formed concurrently; thus, the above structure can be achieved easily. Another embodiment of the present invention is a light-emitting device having the above structure, in which the outline includes a depression and a projection in a top view.

Another embodiment of the present invention is a light-emitting device having the above structure, in which the outline of at least one of the plurality of separation layers includes a depression and a projection in a top view.

Another embodiment of the present invention is a light-emitting device having the above structure, in which the shape of the depression and the projection is one or more of a quadrilateral, a triangle, a hemisphere, or a wave shape. Further, another embodiment of the present invention is a light-emitting device having the above structure, in which the outline of at least one of the plurality of separation layers is circular, elliptical, quadrilateral, triangular, or hexagonal.

Another embodiment of the present invention is a lighting device including the light-emitting device having the above structure.

The light-emitting device according to an embodiment of the present invention is a light-emitting device with high reliability. The light-emitting device according to an embodiment of the present invention is a light-emitting device with a high manufacturing yield. The light-emitting device according to an embodiment of the present invention is a light-emitting device with high reliability and low power consumption. The light-emitting device according to an embodiment of the present invention is a light-emitting device with a high manufacturing yield and low power consumption. The light-emitting device according to an embodiment of the present invention is a light-emitting device with high reliability, a high manufacturing yield, and low power consumption.

The lighting device according to an embodiment of the present invention is a lighting device with high reliability. The lighting device according to an embodiment of the present invention is a lighting device with a high manufacturing yield. The lighting device according to an embodiment of the present invention is a lighting device with high reliability and low power consumption. The lighting device according to an embodiment of the present invention is a lighting device with a high manufacturing yield and low power consumption. The lighting device according to an embodiment of the present invention is a lighting device with high reliability, a high manufacturing yield, and low power consumption.

DETAILED DESCRIPTION OF THE INVENTION

Figure 1A:
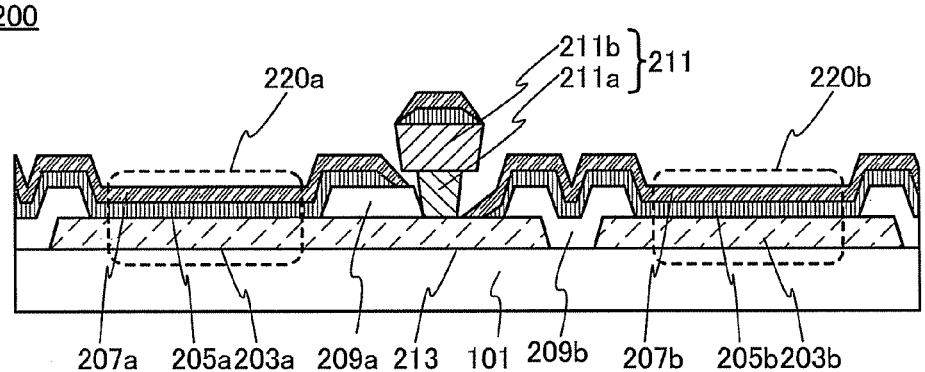
FIGS. 1A and 1B illustrate a structure of a light-emitting device according to an embodiment of the present invention.

Hereinafter, embodiments of the present invention will be described with reference to the accompanying drawings. Note that the present invention can be carried out in many different modes, and it is easily understood by those skilled in the art that modes and details of the present invention can be modified in various ways without departing from the spirit and the scope of the present invention. Therefore, the present invention is not construed as being limited to description of the embodiments.

Note that for easy understanding, the magnification ratio and the reduction ratio of each component in drawings is not constant, and thus the relationship of thickness, length, and size of each component in the drawings does not necessarily show the ratios of thickness, length, and size of a light-emitting device which is an embodiment of the present invention. As for the reference numerals, the same numbers with different alphabets are considered as being in the same group in some cases. In the case where only the number is shown, the number indicates the group of the components with the same numbers with different alphabets.

In this specification, "outline" means the outermost outline when an object is seen from a direction perpendicular to an insulating surface unless otherwise specified (i.e., unless a position is specified). In other words, "outline" means the outline of a protruding portion which protrudes most.

In this specification, in the case where two or more of the light-emitting regions are provided, when the light-emitting regions include electrodes having the same potential, the light-emitting regions are considered to be in one EL element even when the light-emitting regions are separated.
(Embodiment 1)

Figure 1B:
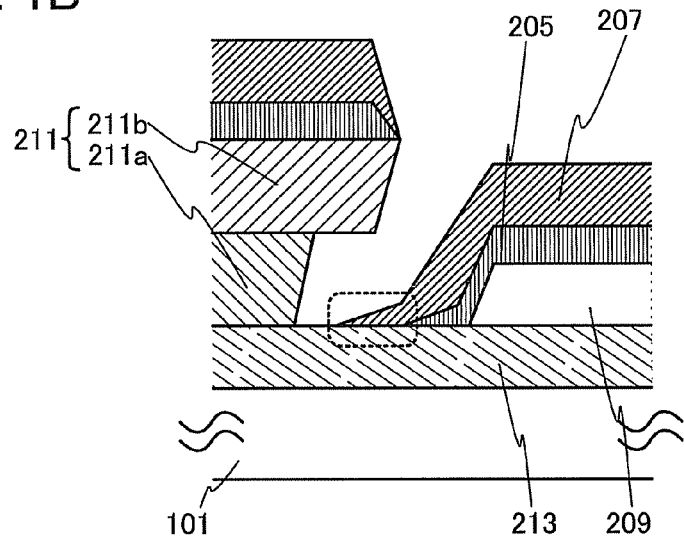

FIGS. 1A and 1B are schematic cross-sectional views of a light-emitting device according to an embodiment of the present invention. Note that here, part of the light-emitting device according to an embodiment of the present invention is illustrated. FIG. 1A is a schematic cross-sectional view of a light-emitting device 200 including an EL element. In the light-emitting device 200, a first electrode 203, an EL layer 205, and a second electrode 207 are provided in this order over the substrate 101 having an insulating surface, and a portion where these components are in contact with one another is a light-emitting region 220 of the EL element.

In this specification, it has already been stated that in the case where a plurality of light-emitting regions is provided, the light-emitting regions which include electrodes having the same potential are considered to be in one EL element even in the case where the light-emitting regions are separated. In contrast, when the first electrodes 203 in the plurality of light-emitting regions have significantly different potentials and so do the second electrodes 207 in the plurality of light-emitting regions, the light-emitting regions are considered to be in different EL elements. In the light-emitting region 220a and the light-emitting region 220b in the cross-sectional view of FIG. 1A, the first electrode 203a of the light-emitting region 220a and the second electrode 207b of the light-emitting region 220b are connected to each other in series, and the first electrode 203a and the first electrode 203b are at different potentials and the second electrode 207a and the second electrode 207b are at different potentials in light emission; thus, the light-emitting region 220a and the light-emitting region 220b are considered to be in different EL elements. Hereinafter, in this embodiment, an EL element including the light-emitting region 220a is referred to as an EL element a, and an EL element including the light-emitting region 220b is referred to as an EL element b.

The light-emitting device 200 includes a wiring 213 which is electrically connected to the second electrode 207, a separation layer 211 provided over the wiring 213, and an insulating layer 209 formed over the wiring 213. When voltage is applied to the first electrode 203 and the second electrode 207 and current flows through the EL layer 205 which is sandwiched between the first electrode 203 and the second electrode 207, the EL element emits light.

In the EL element, an electrode layer on the side from which light is extracted is formed using a material having a light-transmitting property with respect to light emitted from the EL element. For example, a light-transmitting conductive material is used for the second electrode 207 in the case of a top emission type, for the first electrode 203 in the case of a bottom emission type, or for each of the electrodes in the case of a dual emission type.

The separation layer 211 is provided over the wiring 213. The separation layer 211 has a shape in which an outline of the bottom portion is inside an outline of the separation layer 211. In other words, the separation layer 211 has a protruding upper portion which protrudes outside more than the bottom portion. For example, a so-called reverse tapered shape, a shape of the separation layer 211 including a narrow leg portion 211a and a wide stage portion 211b as illustrated in FIG. 1A, or the like corresponds to the above described shape. There is no particular limitation on the shape between the outline of the separation layer 211 and the outline of the bottom portion; however, a shape having a step or curvature is preferable to a shape represented by straight lines because the second electrode 207 can be divided more surely. For the same reason, difference in size of the outline of the separation layer 211 and the outline of the bottom portion of the separation layer 211 is preferably large.

The EL layer 205 is divided into the EL layer 205a of the EL element a and the EL layer 205b of the EL element b in formation because of the presence of the separation layer 211. Similarly, the second electrode 207 is divided into the second electrode 207a of the EL element a and the second electrode 207b of the EL element b in formation. When the second electrode 207 is formed by a highly isotropic method, the second electrode 207 extends to be closer to the outline of the separation layer 211 (in a space under the protruding portion of the separation layer 211) than the EL layer 205. Accordingly, the second electrode 207b of the EL element b is in contact with the wiring 213 formed below the separation layer 211. In addition, the wiring 213 is electrically connected to the first electrode 203a of the EL layer a, so that the second electrode 207b of the EL element b and the first electrode 203a of the EL element a can be connected to each other, which enables series connection between the EL element a and the EL element b. In other words, the second electrode 207b of the EL element b and the wiring 213 are in contact with each other inside the outline of the separation layer 211; thus, the EL element b and the EL element a are connected to each other in series.

The EL layer 205 and the second electrode 207 are formed after the first electrode 203, the wiring 213, the insulating layer 209, and the separation layer 211 are formed over the substrate 101. The EL layer 205 can be formed by a film formation method such as a vacuum evaporation method, for example, and the second electrode 207 can be foamed by a film formation method such as a vacuum evaporation method or a sputtering method, for example.

In order that the second electrode 207 extends more on the inside of the outline of the separation layer 211 than the EL layer 205, for example, a method in which the distance between a sputtering target or an evaporation source and the substrate 101 is shortened can be given. Alternatively, a method in which a sputtering target or an evaporation source is placed obliquely to the substrate 101, or a method in which the substrate 101 is moved in an in-plane direction can be given.

As described above, in the light-emitting device of this embodiment, the EL layer 205 and the second electrode 207 can each be divided without a metal mask, so that a series connection structure can be obtained. Therefore, the light-emitting device of this embodiment can have favorable reliability. Further, the light-emitting device can be manufactured with high yield.

Since the separation layer 211 is formed before the EL layer 205 is formed, a photolithography technique can be used. Therefore, as compared to a light-emitting device manufactured using a metal mask, the area loss in the light-emitting device of this embodiment can be reduced and the proportion of a light-emitting region in the light-emitting device can be increased.

In FIG. 1A, the second electrode 207b of the EL element b is in contact with the wiring 213 connected to the first electrode 203a of the EL element a, so that the EL element a and the EL element b are connected to each other in series. The insulating layer 209a is formed between part of the outline of the separation layer 211, which faces the EL layer a, and the wiring 213 thereunder, so that connection between the second electrode 207a of the EL element a and the wiring 213 is prevented. In other words, the insulating layer 209a is formed below part of the outline of the separation layer 211 on the side which faces the EL element including the first electrode having the same potential as the wiring 213. The insulating layer 209a is formed so as to prevent at least connection between the second electrode 207a and the wiring 213. When the insulating layer 209a is formed so that an end portion of the insulating layer 209a on the separation layer 211 side is in contact with the outline of the bottom portion of the separation layer 211, the contact between the second electrode 207a of the EL element a and the wiring 213 can be suppressed more surely.

The insulating layer 209b which is formed to cover end portions of the first electrode 203 and the wiring 213 is provided for preventing the EL layer 205b and the second electrode 207b from being disconnected at a step of the first electrode 203b. Therefore, the insulating layer 209b preferably has a forward tapered shape so that a film formed thereover is not disconnected. In the forward tapered shape, a layer gradually increases in thickness from its edge and is in contact with a layer serving as a base in a cross section.

FIG. 1B is an enlarged schematic cross-sectional view of a region in which the wiring 213 and the second electrode 207 are connected to each other.

A region surrounded by a dashed line in FIG. 1B is a contact portion between the wiring 213 and the second electrode 207. The wiring 213 and the second electrode 207 are in contact with each other inside the outline of the separation layer 211; that is, the second electrode 207 is in contact with a surface of the wiring 213 existing between the outline of the separation layer 211 and the outline of the bottom portion of the separation layer 211. Thus, the wiring 213 and the second electrode 207 are electrically connected to each other. Here, a portion of the second electrode 207 which is in contact with the wiring 213 is thinner than a portion of the second electrode 207 in the light-emitting region 220 (a region where the first electrode 203, the EL layer 205, and the second electrode 207 are stacked in contact with one another). The contact portion may have a so-called forward tapered shape in which the contact portion becomes thinner as it is closer to the outline of the bottom portion of the separation layer 211. Thus, when the contact portion is formed thin, even in the case where a space between the side surface of the separation layer 211 and the wiring 213 is small, a contact area can be increased, which results in low contact resistance.

In a method for manufacturing a light-emitting device, a metal mask having an opening portion overlapping with an EL element is generally used in formation of the EL layer 205 and the second electrode 207. However, when the separation layer 211 is provided in this manner, the light-emitting device 200 can be manufactured without a metal mask. Accordingly, an increase in cost when a metal mask is used, or a problem caused due to contact between the metal mask and a substrate can be suppressed.

Note that in FIG. 1A, the separation layer 211 separates the EL element including the light-emitting region 220a from the EL element including the light-emitting region 220b and connects a cathode of one of the EL elements and an anode of the other in series. However, in the case where the separation layer 211 is used only for separating adjacent EL elements, the separation layer 211 may be formed not over the wiring 213 but over the insulating layer 209a.

FIGS. 2A to 2E each illustrate part of a schematic top view (a schematic view seen from the direction perpendicular to a substrate) of a light-emitting device of this embodiment. As described with reference to FIGS. 1A and 1B, the wiring 213 is electrically connected to the first electrode 203a of the EL element a, and an end portion of the wiring 213 is indicated by a dashed-dotted line in FIGS. 2A to 2E. The separation layer 211 is formed over the wiring 213, and the outline of the separation layer 211 is indicated by a solid line. The insulating layer 209a is formed at least below the outline of the separation layer 211, which faces the EL layer a, and inside the outline, and an end portion of the insulating layer 209a is indicated by a dashed line. The insulating layer 209b is formed to cover an end portion of the wiring 213 and an end portion of the first electrode 203b (not illustrated) of the EL element b. The EL layer 205 and the second electrode 207 are omitted for simplicity.

The EL layer 205 and the second electrode 207 are each divided by the separation layer 211. The second electrode 207 and the wiring 213 are in contact with each other along and inside the outline of the separation layer 211 by utilizing the difference between an amount of the EL layer 205 extending inside the outline and that of the second electrode 207 extending inside the outline. When the contact resistance between the second electrode 207 and the wiring 213 is high, extra power is consumed, and thus, power consumption is increased. Since the amount of the second electrode 207 extending inside the outline depends on a deposition method, the length of the separation layer 211 needs to be increased in order that the contact area between the second electrode 207 and the wiring 213 is increased.

The separation layer 211 for forming a series connection portion of an EL element is provided along one side of a light-emitting region in the EL element. Accordingly, extending the separation layer 211 logically means extending the side and the opposite side of the light-emitting region. In the case where another side and its opposite side of the light-emitting region are extended at substantially the same rate as the side along which the series connection portion is formed, current necessary for light emission is increased accordingly. Therefore, the resistance of the series connection region existing in the current path needs to be lowered in accordance with the current flowing though the current path. However, the light-emitting region can be two-dimensionally extended in longitudinal and lateral directions, while the series connection portion is extends in only a longitudinal (length) direction. In other words, in this case, a problem caused due to contact resistance in the series connection portion tends to become relatively worse. In the case where another side and the opposite side thereof in the light-emitting region are not extended and the side along which the series connection portion is formed and the opposite side thereof are extended, the series connection portion and the light-emitting region are extended only in one dimension, so that the problem caused due to the contact resistance in the series connection portion becomes neither worse nor better. In the case where the side along which the series connection portion is formed and the opposite side thereof are extended and another side and the opposite side thereof are shortened, the problem of the contact resistance in the series connection portion is improved, while an area where the series connection portion (non-light-emitting region) is formed is greatly increased with respect to the light-emitting region, and thus, an aperture ratio is decreased. Further, since the number of stages of EL elements which are connected in series is increased, there is a problem of an increase in driving voltage, or the like.

Here, the present inventors have found that a contact area can be increased not by changing the length of the separation layer 211 itself for extending the length of the contact portion but by extending the length of the outline of the separation layer 211 and that the contact resistance can be reduced.

In other words, the present inventors have found that the length of the contact portion between the second electrode 207 divided by the outline and the wiring 213 can be increased in such a manner that the outline of the separation layer 211 has depressions and projections in a top view or the separation layer 211 includes a plurality of island-shaped separation layers although the formation area of the separation layer 211 is not increased.

Figure 2A:
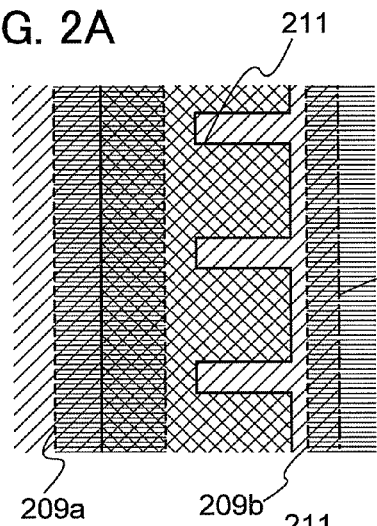
FIGS. 2A to 2E each illustrate a structure of a light-emitting device according to an embodiment of the present invention.
Figure 2B:
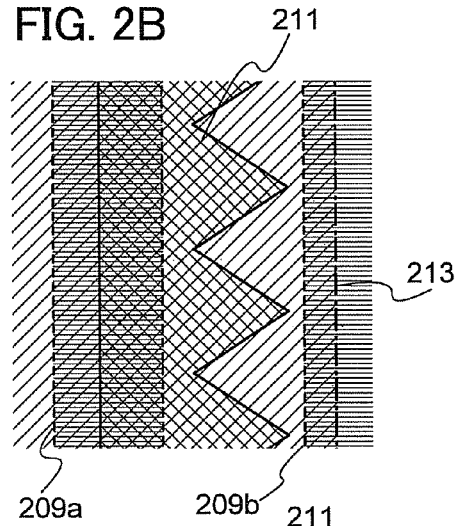
Figure 2C:
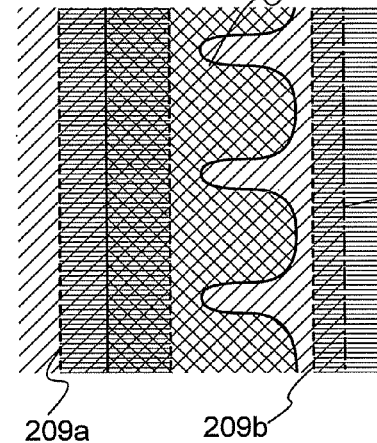
Figure 2D:
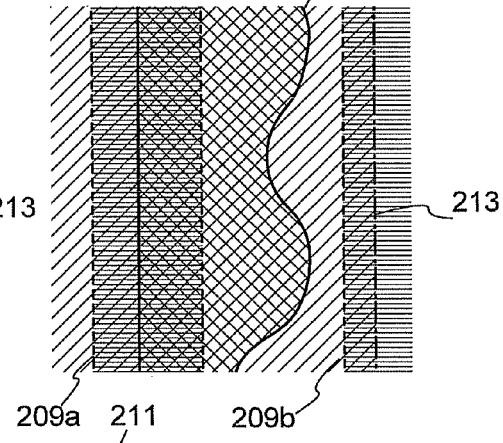
Figure 2E:
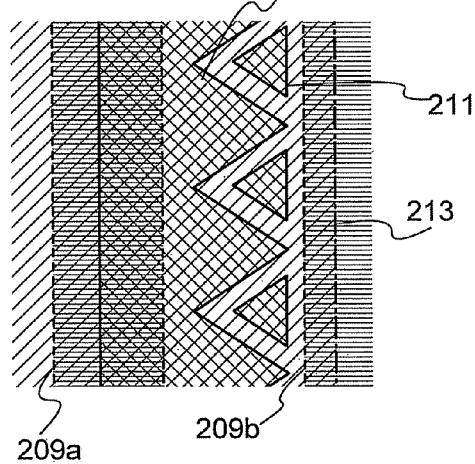

FIG. 2A illustrates the case where the outline of the separation layer 211 has a comb-like shape. FIG. 2B illustrates the case where the outline of the separation layer 211 has a mountain-like shape. FIG. 2C illustrates the case where the outline of the separation layer 211 has a comb-like shape with a rounded tip. FIG. 2D illustrates the case where the outline of the separation layer 211 has a wave-like shape. Since a structure for forming a series connection structure is described in this embodiment, the insulating layer 209a is formed at least in the lower portion of and inside the outline of the separation layer 211 on the EL element side which includes the first electrode 203 having the same potential as the wiring 213; thus, the second electrode 207 which is divided at an end portion of the separation layer 211 on the insulating layer 209a side is prevented from being in contact with the wiring 213. Therefore, the length of the outline which is effective for a reduction of the contact resistance in the series connection portion is the length of a portion of the outline where the insulating layer is not formed at least between the outline and the wiring 213. Note that as in the second electrode 207, the EL layer 205 is divided by the separation layer. Accordingly, it is possible that the EL layer 205 exists between the separation layer 211 and the wiring 213 depending on a formation method of the EL layer 205. The EL layer 205 basically has an insulating property. However, in an embodiment of the present invention, connection is obtained by utilizing the difference between an amount of the second electrode 207 extending inside the outline of separation layer and that of the EL layer 205 extending inside the outline, and a series connection portion can be formed even in the case where the EL layer 205 exists between the separation layer 211 and the wiring 213; therefore, the EL layer 205 is not categorized as the above insulating layer. FIG. 2E illustrates the case where a plurality of island-shaped insulating layers is provided. In this case, the sum of the length of the outlines of the plurality of island-shaped separation layers 211 corresponds to the length of the outline in FIGS. 2A to 2D. As described above, when a portion which is depressed in the short (width) direction of the separation layer 211 is included in the outline of the separation layer 211, the length of the contact portion between the second electrode 207 and the wiring 213 can be increased without a change in the formation region of the separation layer 211 itself, leading to an increase in contact area. Accordingly, contact resistance of the series connection portion is reduced, leading to a reduction in power consumption. Note that the shape of the outline of the separation layer 211 in the light-emitting device of this embodiment is not limited to the above shapes.

The depressions included in the outline of the separation layer 211 are preferably as deep in the width direction as possible because the length of the outline can be increased. Further, the depressions are preferably formed densely.

Note that an outline of the separation layer facing the light-emitting region of the light-emitting element, which does not have the concept of an embodiment of the present invention, does not include a depression and a projection. A side of a light-emitting region generally does not have a depression and a projection; therefore, it can be said that contact resistance can be effectively reduced when the outline of the separation layer in this embodiment is longer than the side of the light-emitting region facing the separation layer.

Further, it can be said that the shape of the outline of the separation layer which does not have the concept of the present invention is a quadrilateral. Thus, supposing that there is a separation layer having an outline having a shape of a quadrilateral formed in the same formation region as the separation layer in this embodiment, when the outline of the separation layer of this embodiment is longer than at least the outline of the quadrilateral separation layer, an effect of reducing contact resistance can be obtained. Here, a contact is actually formed below the outline where the insulating layer does not overlap; therefore, the lengths of the outlines which do not overlap with an insulating layer (except for an EL layer) are compared. Further, more specifically, "a quadrilateral formed in the same formation region as the separation layer in this embodiment" can be paraphrased as "the smallest quadrilateral which can cover the separation layer in this embodiment".

Figure 3:
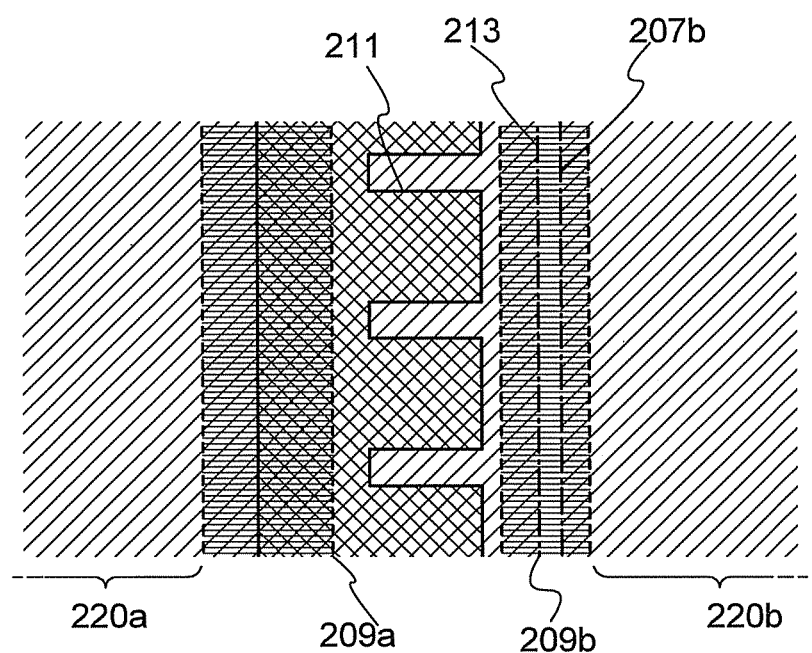
FIG. 3 illustrates a structure of a light-emitting device according to an embodiment of the present invention.

FIG. 3 is a top view of the series connection portion, which illustrates a wider region. As described above, the light-emitting device in this embodiment has a series connection structure of EL elements. The series connection structure of the EL element a and the EL element b is provided in a region between the light-emitting region 220a in the EL element a and the light-emitting region 220b in the EL element b.

(Embodiment 2)

Figure 4:
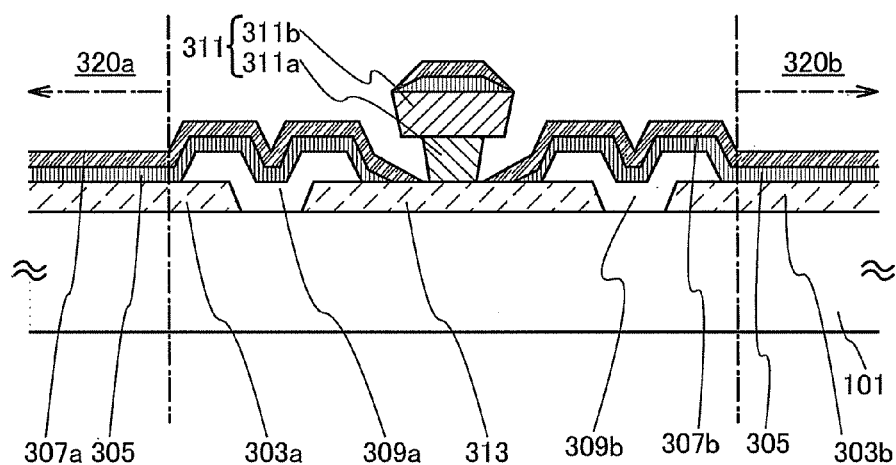
FIG. 4 illustrates a structure of a light-emitting device according to an embodiment of the present invention.

FIG. 4 is a cross-sectional view of a light-emitting device according to an embodiment of the present invention, which is different from that in Embodiment 1. Note that FIG. 4 illustrates part of the light-emitting device according to an embodiment of the present invention. As in the light-emitting device in FIGS. 1A and 1B, in the light-emitting device in FIG. 4, a first electrode 303, an EL layer 305, and a second electrode 307 are provided in this order over the substrate 101 having an insulating surface, and a portion where these components are in contact with one another is a light-emitting region 320 of an EL element. In the EL element, an electrode layer on the side from which light is extracted is formed using a material which transmits light from the EL layer. For example, a light-transmitting conductive material is used for the second electrode 307 in the case of a top-emission type, for the first electrode 303 in the case of a bottom-emission type, or for each of the electrodes in the case of a dual-emission type.

In this specification, in the case where a plurality of the light-emitting regions is provided, the light-emitting regions which include electrodes having the same potential all the time are considered to be in one EL element even in the case where the light-emitting regions are separated. Although not illustrated in FIG. 4, the first electrode 303a and the first electrode 303b have the same potential. In other words, it can be said that the light-emitting region 320a and the light-emitting region 320b are different light-emitting regions in one EL element. Note that the light-emitting region 320a and the light-emitting region 320b may be connected to each other in a region which is not illustrated in the cross section in FIG. 4.

In the light-emitting device in FIG. 4, a conductive layer 313 which is electrically independent from the first electrode 303a and the first electrode 303b is provided, and a separation layer 311 is provided over the conductive layer 313. The separation layer 311 has a shape in which an outline of the bottom portion is inside an outline of the separation layer 311. In other words, the separation layer 311 has a protruding upper portion which protrudes outside more than the bottom portion. For example, a so-called reverse tapered shape, a shape of a structure including a narrow leg portion 311a and a wide stage portion 311b, or the like corresponds to the above described shape. There is no particular limitation on the shape between the outline of the separation layer 311 and the outline of the bottom portion; however, a shape having a step or curvature is preferable to a shape represented by straight lines because the second electrode 307 can be divided more surely. For the same reason, difference in size of the outline of the separation layer 311 and the outline of the bottom portion of the separation layer 311 is preferably large.

The EL layer 305 is divided because of the presence of the separation layer 311 at the time of formation. The second electrode 307 is also divided at the time of formation. When the second electrode 307 is formed by a highly isotropic method, the second electrode 307 extends to be closer to the outline of the separation layer 311 (in a space under the protruding portion of the separation layer 211) than the EL layer 305. Thus, the second electrode 307a and the second electrode 307b are in contact with the conductive layer 313 formed below the separation layer 311. In addition, the second electrode 307a and the second electrode 307b are electrically connected to the conductive layer 313. As the conductive layer 313, a structural body which has lower resistance than the second electrodes 307a and 307b is used, whereby the conductive layer 313 can be used as an auxiliary wiring of the second electrodes 307a and 307b. This structure is particularly effective in the case where the second electrodes 307a and 307b are each a light-transmitting electrode with relatively low conductivity, i.e., in the case where light is extracted from the second electrode 307 side.

The conductive layer 313 and the second electrode 307 are in contact with each other inside the outline of the separation layer 311; that is, the second electrode 307 is in contact with a surface of the conductive layer 313 existing between the outline of the separation layer 311 and the outline of the bottom portion of the separation layer 311. Thus, the conductive layer 313 and the second electrode 307 are electrically connected to each other. Here, a portion of the second electrode 307 which is in contact with the conductive layer 313 is thinner than a portion of the second electrode 307 in the light-emitting region 320. Further, the contact portion may have a so-called forward tapered shape in which the contact portion becomes thinner as it is closer to the outline of the bottom portion of the separation layer 311. Thus, when the contact portion is formed thin, even in the case where a space between the side surface of the separation layer 311 and the conductive layer 313 is small, the contact area can be increased, which results in low contact resistance.

The EL layer 305 and the second electrode 307 are formed after the first electrode 303, the conductive layer 313, the insulating layer 309, and the separation layer 311 are formed over the substrate 101. The EL layer 305 can be fowled by a film formation method such as a vacuum evaporation method, for example, and the second electrode 307 can be formed by a film formation method such as a vacuum evaporation method or a sputtering method, for example.

In order that the second electrode 307 extends more on the inside of the outline of the separation layer 311 than the EL layer 305, for example, a method in which the distance between a sputtering target or an evaporation source and the substrate 101 is shortened can be given. Alternatively, a method in which a sputtering target or an evaporation source is placed obliquely to the substrate 101, or a method in which the substrate 101 is moved in an in-plane direction can be given.

As described above, in the light-emitting device of this embodiment, the EL layer 305 and the second electrode 307 can each be divided without a metal mask, so that an auxiliary wiring can be formed. Therefore, the light-emitting device of this embodiment can have favorable reliability. Further, the light-emitting device can be manufactured with high yield.

Since the separation layer 311 is formed before the EL layer 305 is formed, a photolithography technique can be used. Therefore, as compared to a light-emitting device formed using a metal mask, the layout area for mask alignment can be reduced and the proportion of a light-emitting region in the light-emitting device can be increased.

The insulating layer 309a and the insulating layer 309b which cover end portions of the first electrode 303 and the conductive layer 313 are formed for preventing the EL layer 305 and the second electrode 307 from being disconnected at steps of the first electrode 303 and the conductive layer 313. Therefore, the insulating layers 309a and 309b preferably each have a forward tapered shape so that a film formed thereover is not broken. In the forward tapered shape, a layer gradually increases in thickness from its edge and is in contact with a layer serving as a base in a cross section.

FIGS. 5A to 5F are each part of a schematic top view (a schematic view seen from a direction perpendicular to a substrate) of a light-emitting device of this embodiment. As described with reference to FIG. 4, the conductive layer 313 is a layer which is electrically independent from the first electrodes 303a and 303b of the EL elements. An end portion of the conductive layer 313 is indicated by a dashed-dotted line in FIGS. 5A to 5F. The separation layer 311 is formed over the conductive layer 313, and the outline of the separation layer 311 is indicated by a thick solid line. The insulating layers 309a and 309b are formed to cover end portions of the first electrode 303 and the conductive layer 313. The EL layer 305 and the second electrode 307 are omitted for simplicity. The light-emitting regions 320a and 320b each include the EL layer 305 and the second electrode 307. The separation layer 311 and the conductive layer 313 which form an auxiliary wiring are formed between the light-emitting regions 320a and 320b. As described above, the light-emitting regions 320a and 320b are in one EL element in this embodiment.

The EL layer 305 and the second electrode 307 are each divided by the separation layer 311. The second electrode 307 and the conductive layer 313 are in contact with each other along and inside the outline of the separation layer 311 by utilizing the difference between the amount of the EL layer 305 extending inside the outline and that of the second electrode 307 extending inside the outline. When the contact resistance between the second electrode 307 and the conductive layer 313 is high, extra power is consumed, and thus, power consumption is increased. However, as described in this embodiment, the contact area can be increased by an increase in the length of the outline of the separation layer 311; thus, contact resistance can be reduced.

In other words, the present inventors have found that the length of the contact portion between the conductive layer 313 and the second electrode 307 divided by the outline can be increased in such a manner that the outline of the separation layer 311 has depressions and projections in a top view or the separation layer 311 includes a plurality of island-shaped separation layers although the formation area of the separation layer 311 is not increased. Note that superiority of an embodiment of the present invention over the case of increasing the length of the separation layer 311 itself is described in Embodiment 1; therefore, the description in Embodiment 1 is to be referred to.

Figure 5A:
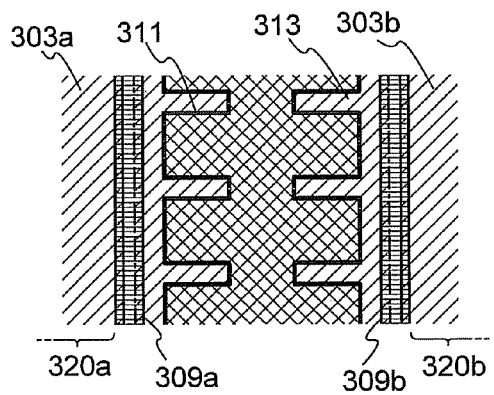
FIGS. 5A to 5F each illustrate a structure of a light-emitting device according to an embodiment of the present invention.
Figure 5B:
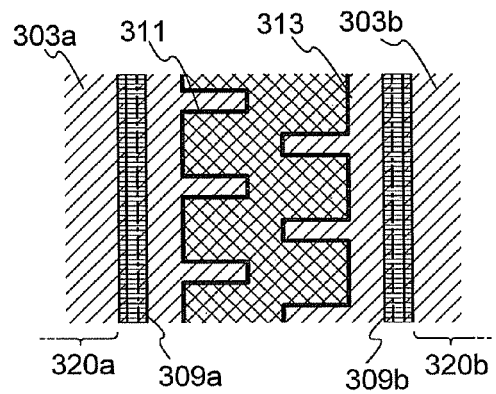
Figure 5C:
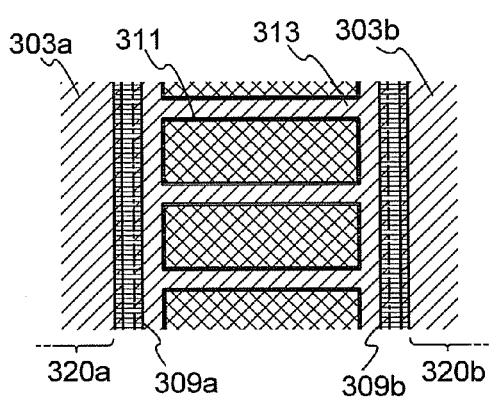
Figure 5D:
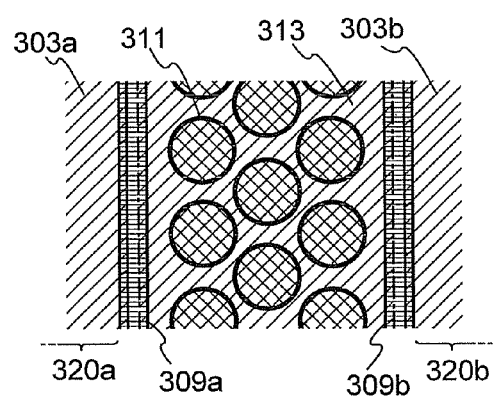
Figure 5E:
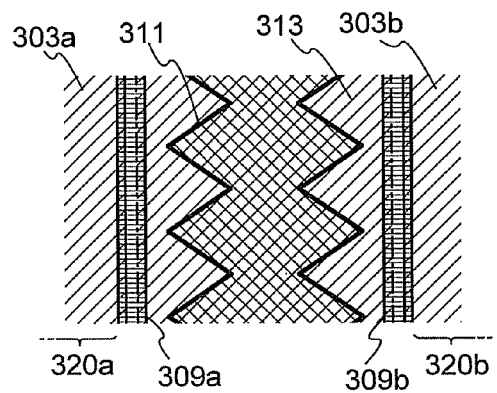
Figure 5F:
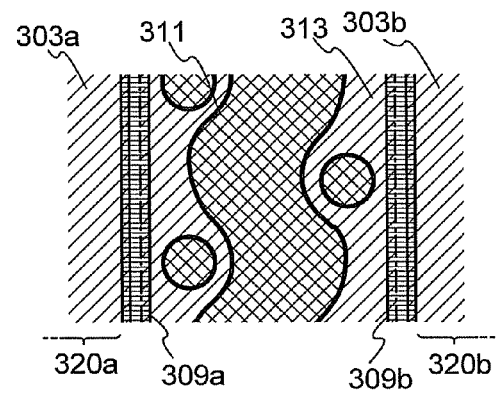

FIG. 5A illustrates the case where the outline of the separation layer 311 has a comb-like shape. FIG. 5B illustrates the case where the separation layer 311 has a meandering shape. FIG. 5C illustrates the case where the separation layers 311 are formed as a plurality of quadrilateral separation layers. FIG. 5D illustrates the case where the separation layers 311 are formed as a plurality of circular separation layers. FIG. 5E illustrates the case where the outline of the separation layer 311 has a mountain-like shape. FIG. 5F illustrates the case where a separation layer with a wave outline and a circular separation layer are combined. Note that the shape of the separation layer according to an embodiment of the present invention is not limited to the above shapes. When a portion which is depressed in the short (width) direction of the separation layer 311 is included in the outline or when the separation layers 311 are formed as a plurality of island-shaped separation layers, the length of the contact portion between the second electrode 307 and the conductive layer 313 can be increased without a change in the formation region of the separation layer 311 itself, leading to an increase in contact area. Accordingly, the contact resistance between the conductive layer 313 serving as an auxiliary wiring and the second electrode 307 is reduced, and a voltage drop of the second electrode 307 can be effectively suppressed.

The depressions included in the outline of the separation layer 311 are preferably as deep in the width (short axis) direction as possible because the length of the outline can be increased. Further, the depressions are preferably formed densely.

Note that an outline of the separation layer facing the light-emitting region of the light-emitting element, which does not have the concept of an embodiment of the present invention, does not include a depression and a projection. A side of a light-emitting region generally does not have a depression and a projection; therefore, it can be said that contact resistance can be effectively reduced when the outline of the separation layer in this embodiment is longer than the side of the light-emitting region facing the separation layer.

Further, it can be said that the shape of the outline of the separation layer which does not have the concept of the present invention is a quadrilateral. Thus, supposing that there is a separation layer having an outline having a shape of a quadrilateral formed in the same formation region as the separation layer in this embodiment, when the outline of the separation layer of this embodiment is longer than at least the outline of the quadrilateral separation layer, an effect of reducing contact resistance can be obtained. Further, more specifically, "a quadrilateral formed in the same formation region as the separation layer in this embodiment" can be paraphrased as "the smallest quadrilateral which can cover the separation layer in this embodiment".

The structure in this embodiment can be used in combination with Embodiment 1.

(Embodiment 3)

Figure 6:
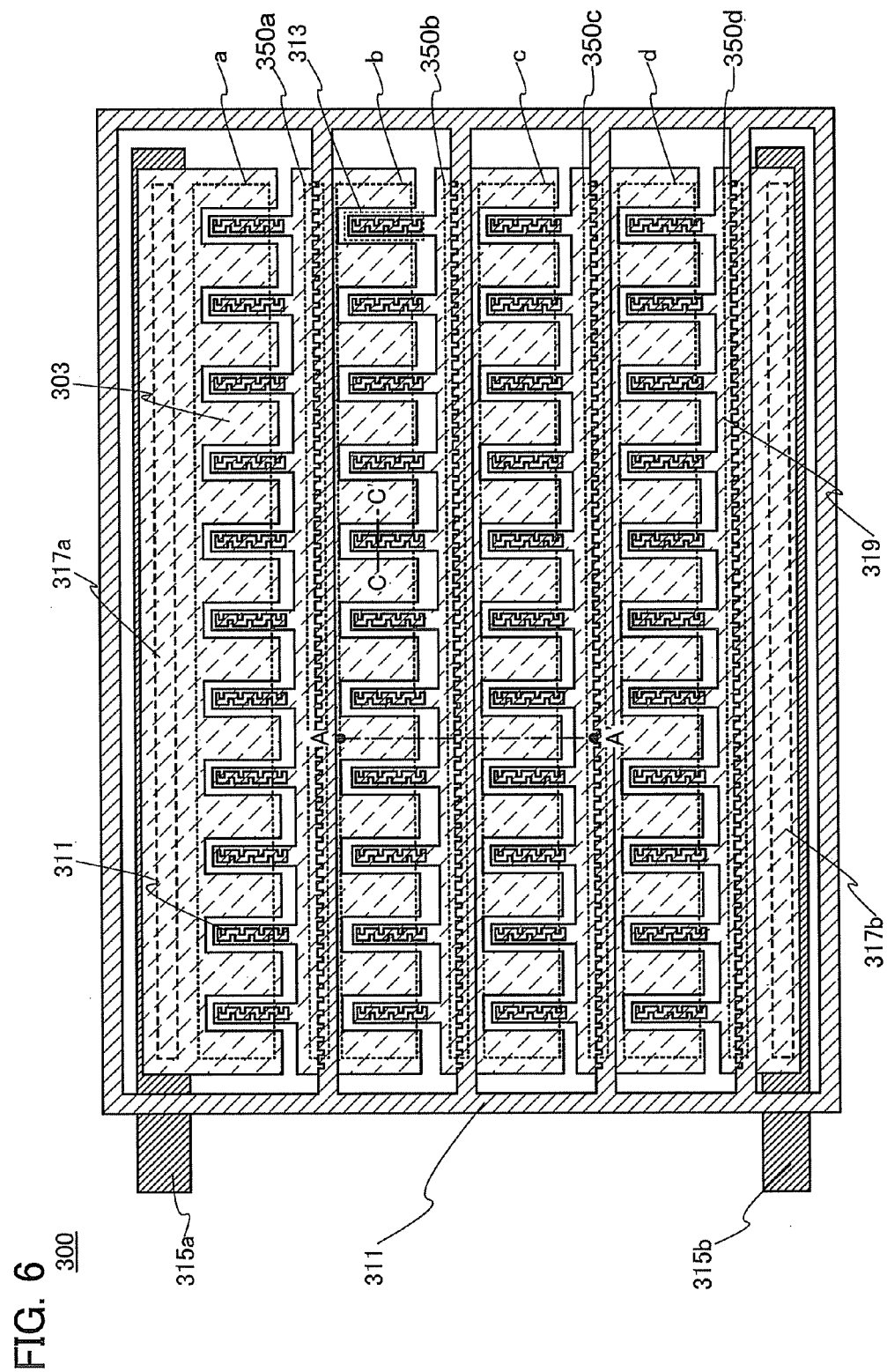
FIG. 6 illustrates a structure of a light-emitting device according to an embodiment of the present invention.

FIG. 6 is a schematic top view of a light-emitting device 300 according to an embodiment of the present invention, in which the structure in Embodiment 1 and the structure in Embodiment 2 are combined.

The light-emitting device 300 includes four EL elements (a first EL element a, a second EL element b, a third EL element c, and a fourth EL element d) surrounded by the separation layer 311. The four EL elements are connected in series by a series connection portion 350a, a series connection portion 350b, a series connection portion 350c, and a series connection portion 350d. Since the structure of the series connection portions is described in Embodiment 1, the description is omitted here. The description in Embodiment 1 is to be referred to. A cross-sectional view taken along line A-A' in FIG. 6 corresponds to the cross-sectional view in FIG. 1A described in Embodiment 1.

Note that the EL layer 305, the second electrode 307, and the like are not illustrated in FIG. 6 for simplicity.

The first electrode 303 of the first EL element a is electrically connected to a wiring 315a through a contact region 317a. The second electrode 307 (not illustrated) of the fourth EL element d is electrically connected to a wiring 315b through a connection wiring 319 and a contact region 317b. Therefore, when voltage is applied between the wiring 315a and the wiring 315b, current can flow through each of light-emitting regions in the EL elements connected in series, and thus, light can be extracted.

Further, in each of the light-emitting regions, a plurality of the conductive layers 313 each serving as an auxiliary wiring for supporting conductivity of the second electrode 307 (not illustrated) is provided along a direction in which current flows and the separation layer 311 is provided over each conductive layer 313 serving as the auxiliary wiring. As described in Embodiment 2, the second electrode 307 (not illustrated) and the conductive layer 313 are electrically connected to each other inside the outline of the separation layer 311. Embodiment 2 is to be referred to for the structures of the conductive layer 313, the separation layer 311 formed thereover, and the auxiliary wiring including them. A cross-sectional view taken along line C-C' in FIG. 6 corresponds to the cross-sectional view of FIG. 4.

Figure 7A:
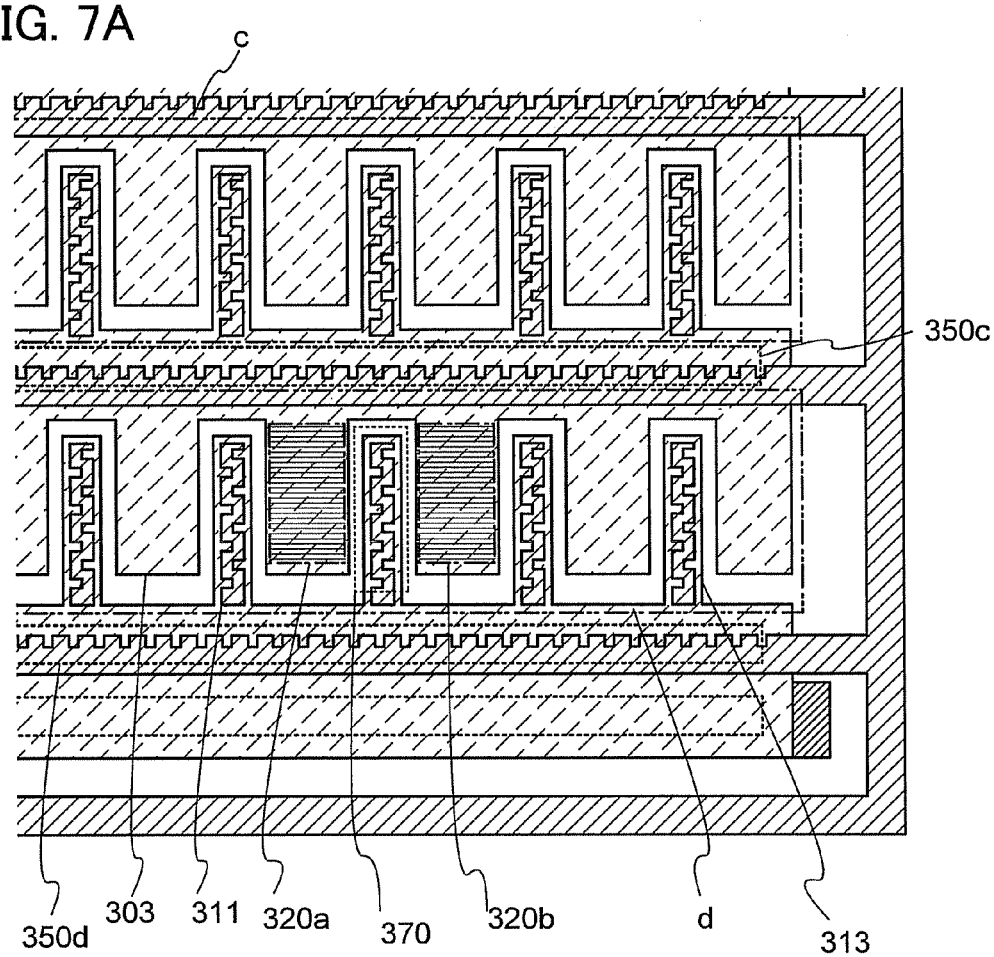
FIGS. 7A and 7B illustrate a structure of a light-emitting device according to an embodiment of the present invention.
Figure 7B:
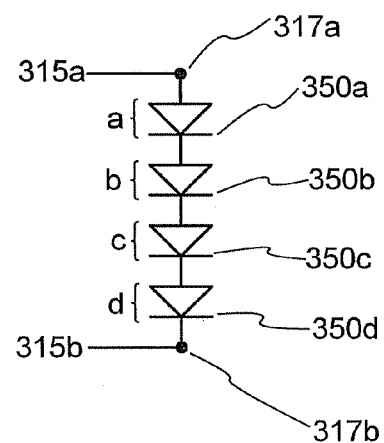

FIG. 7A is an enlarged view of a right lower portion of the light-emitting device 300, and FIG. 7B illustrates an equivalent circuit. As illustrated in FIG. 7A, an auxiliary wiring 370 including the conductive layer 313 and the separation layer 311 is formed in a portion between light-emitting regions in one EL element. For example, the auxiliary wiring 370 is formed between the light-emitting region 320a and the light-emitting region 320b in the EL element d in FIG. 7A.

Note that in a structure as illustrated in FIG. 6, in which an EL element including the conductive layer 313 serving as an auxiliary wiring is connected to a different EL element in series, the conductive layer 313 may be electrically connected to a first electrode of the different EL element. For example, since a second electrode x of an EL element x including the conductive layer 313 serving as an auxiliary electrode is connected to a first electrode y of a different EL element y in series, the conductive layer 313 may be connected to the first electrode y of the EL element y and have the same potential as the first electrode y.

FIG. 7B illustrates an equivalent circuit of the light-emitting device 300 in FIG. 6. The EL elements a to d are connected through the series connection portions 350a to 350d. The wiring 315a is connected to an anode side of the EL element a through the contact region 317a, and the wiring 315b is connected to a cathode side of the EL element d through the contact region 317b. Note that the wiring 315a may be connected to a cathode side and the wiring 315b may be connected to an anode side.

(Embodiment 4)

In this embodiment, an example of a material which can be used for each of the structures in the light-emitting device 300 described in Embodiment 3 and a formation method will be described.

[Substrate]

In the case where the light-emitting device 300 is a bottom emission type or a dual emission type, a light-transmitting material such as glass, quartz, or an organic resin can be used as a material of the substrate 101. In the case of a top emission type, a light-transmitting property is not always necessary, and a material such as a metal, a semiconductor, ceramics, and a colored organic resin can be used other than the above materials. In the case where a conductive substrate is used, the substrate preferably has an insulating property by oxidation of its surface or formation of an insulating film over the surface.

In the case where an organic resin is used for the substrate 101, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

In particular, in the case of the top-emission light-emitting device 300, a substrate having high thermal conductivity, such as a metal substrate, is preferably used. In the case of a large light-emitting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

[Sealing Film and Base Film]

In the case of a bottom-emission or dual-emission light-emitting device, a sealing film and a base film can be formed using a material having a light-transmitting property and a barrier property. In the case of a top-emission light-emitting device, a light-transmitting property is not always necessary.

As each of the sealing film and the base film, an inorganic insulating film can be formed by a sputtering method, for example. For example, a silicon nitride film, an aluminum oxide film, a silicon oxide film, or the like may be formed. The sealing film or the base film which is provided on the side opposite to the direction in which light is extracted may be a stack of a metal film and the above inorganic insulating film.

The sealing film is preferably a gas barrier film in which permeability of moisture is lower than or equal to $10^{-6}$ g/m$^2$·day, for example. A stacked layer structure in which at least one layer containing an inorganic material is provided between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

When an organic resin is used for a substrate, a glass layer with a thickness greater than or equal to 25 μm and less than or equal to 100 μm may be used as a base film. The thickness of the glass layer is typically greater than or equal to 45 μm and less than or equal to 80 μm. By combining an organic resin substrate and a glass layer, it is possible to prevent an adverse effect on an organic compound or a metal material included in the light-emitting element due to entry of moisture, an impurity, or the like from the outside of the light-emitting device, and the weight of the light-emitting device can be reduced.

[Separation Layer]

A separation layer can be formed using, an inorganic insulating material or an organic insulating material. For example, a negative or positive photosensitive resin material, a non-photosensitive resin material, or the like can be used.

Here, an example in which the separation layer is formed using a negative photosensitive organic resin is described.

First, an organic resin film is formed using a negative photosensitive organic resin. The organic resin film can be formed by a coating method such as a spin coating method, a droplet discharging method such as an inkjet method, a printing method such as a screen printing method or an offset printing method, or the like.

Then, region of the organic resin film, in which the separation layer is formed later, is irradiated with exposure light through a mask. Here, the exposure light is adjusted so that the intensity of the exposure light becomes lower in a region closer to the substrate 101 in the thickness direction of the organic resin film. A negative photosensitive organic resin has a property in which solubility of an exposed region in later development treatment is decreased. Therefore, light irradiation is performed so that the intensity of the exposure light on a film surface is highest and the intensity becomes lower in a region closer to the substrate 101, whereby the separation layer which is formed through development treatment has a shape in which the outline becomes smaller in a region closer to the substrate 101.

In the light exposure, focus of the exposure light may be changed so that the intensity of the exposure light in a region close to the substrate 101 becomes low.

Then, development treatment is performed. A region of the organic resin film, which is not irradiated with the exposure light, is removed, so that the separation layer is formed. The separation layer may be cured by heat treatment.

The separation layer may be a single layer as described above or a multilayer including two or more layers. In the case of a multilayer, an insulating organic material and an insulating inorganic material may be used in combination.

[Wiring]

A wiring is formed of a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni), or an alloy material containing any of these materials as its main component. Aluminum can also be used for the material of the wiring; however, in that case, the wiring might be corroded when the wiring is provided to be in direct contact with ITO or the like. Therefore, it is preferable that the wiring have a stacked-layer structure and that aluminum be used for a layer which is not in contact with ITO or the like. Copper can be preferably used because of its low resistance. The thickness of the wiring is preferably greater than or equal to 100 nm and less than or equal to 35 μm.

As a method for forming a conductive film used for a light-emitting element or a wiring, a deposition method such as a sputtering method or a vacuum evaporation method can be used as appropriate. Alternatively, a screen printing method, a droplet discharging method such as an ink-jet method, a plating method, or the like can be used when possible.

[Partition]

As a material of a partition, for example, an organic resin such as polyimide, acrylic, polyamide, or epoxy or an inorganic insulating material can be used.

The angle of a sidewall surface of the partition is greater than or equal to 10° and less than or equal to 85°, preferably greater than or equal to 60° and less than or equal to 80°.

It is particularly preferable that the partition be formed using a photosensitive resin material to have an opening portion so that a sidewall of the opening portion is formed as an inclined surface with continuous curvature. Specifically, the radius of curvature of a curve drawn by a cross section of the partition is desirably approximately 0.2 μm to 2 μm.

There is no particular limitation on the method for forming the partition. A sputtering method, an evaporation method, a coating method, a droplet discharging method (e.g., an inkjet method), a printing method (e.g., a screen printing method or an offset printing method), or the like may be used.

The thickness of the partition may be greater than or equal to 20 nm and less than or equal to 20 μm, for example. The thickness of the partition is preferably greater than or equal to 50 nm and less than or equal to 3 μm

[Planarization Film]

In the case where a planarization film is used, the planarization film can be foamed using an inorganic insulating material or an organic insulating material. Note that a heat-resistant organic insulating material such as an acrylic resin, polyimide, a benzocyclobutene-based resin, polyamide, or an epoxy resin is preferably used as a planarization insulating film. Other than the above organic insulating materials, it is possible to use a low-dielectric constant material (a low-k material), a siloxane-based resin, phosphosilicate glass (PSG), borophosphosilicate glass (BPSG), or the like. Note that the planarization film may be formed by stacking a plurality of insulating films formed using these materials.

A method for forming the planarization film is not particularly limited, and a sputtering method, a spin coating method, a dipping method, a printing method, an inkjet method, or the like can be used depending on the material of the planarization film.

This embodiment can be combined with any of the other embodiments disclosed in this specification as appropriate.

Then, an EL element will be described with reference to FIGS. 8A and 8B. One of a pair of electrodes of a first electrode and a second electrode included in the EL element functions as an anode 702 and the other functions as a cathode 704. The EL element in this embodiment may be used in a top-emission light-emitting device in which light is emitted in the direction opposite to the substrate 101 or a bottom-emission light-emitting device in which light is emitted in the direction of the substrate 101; however, the structure of the EL element in this embodiment is particularly suitable for a top-emission light-emitting device. The electrode through which light is extracted is formed using a material which transmits at least visible light. The other electrode is preferably formed using a material with high reflectivity so that light emitted in the direction of the other electrode can also be effectively extracted.

As a material of the electrode serving as an anode, a material having a high work function (specifically, a work function of higher than or equal to 4.0 eV) is preferably used. As such a material, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (for example, titanium nitride), and the like can be given. Other than the above, a conductive metal oxide having a light-transmitting property, such as indium oxide ($In_2O_3$), indium tin oxide ($In_2O_3$—$SnO_2$: also referred to as ITO), indium zinc oxide ($In_2O_3$—ZnO), zinc oxide (ZnO), or zinc oxide to which gallium is added may be used. Films of these conductive metal oxides are usually formed by sputtering; however, a sol-gel method or the like may be used. In the case where light is extracted from the anode side, any of the conductive metal oxides having a light-transmitting property may be used for the anode. In the case where the anode is formed using another material, the anode can have a light-transmitting property when formed so thin that the anode can transmit light. Alternatively, a stacked-layer structure including a plurality of materials may be used. Note that with the use of a composite material described later for a surface which is in contact with an anode of the EL layer 103, an electrode material can be selected regardless of its work function.

As a material of the electrode serving as a cathode, a material having a low work function (specifically, a work function of lower than or equal to 3.8 eV) is preferably used. As examples of such a material, metals belonging to Group 1 or 2 of the periodic table, such as lithium (Li), cesium (Cs), magnesium (Mg), calcium (Ca), and strontium (Sr); an alloy containing any of the above metals (e.g., MgAg or AlLi); rare earth metals such as europium (Eu) and ytterbium (Yb); an alloy containing such a rare earth metal; aluminum (Al); an aluminum alloy; and the like are given. When light is extracted from the cathode side, such a material is deposited thin so that light can be transmitted sufficiently, to form a transparent conductive film. Further, after the material is deposited thin so that light can be transmitted, the above conductive metal oxide having a light-transmitting property may be stacked thereover. Note that an alkali metal, an alkaline earth metal, a compound thereof, or a substance exhibiting an electron-transport property to which a substance exhibiting an electron-donating property with respect to the substance exhibiting an electron-transport property (hereinafter referred to as a material having a donor level) is added is used for the cathode of the EL layer 103; thus, the electrode material can be selected regardless of its work function. In other words, an oxide transparent conductive material typified by ITO can be used as a material of the cathode. With the use of a charge-generation layer formed by stacking a layer formed using a composite material and a layer formed using a material having a donor level, a similar effect can be obtained (note that in that case, the layer formed using the composite material is in contact with the cathode).

Alternatively, a light-transmitting conductive macromolecule may be used for the anode. As the conductive macromolecule, for example, a π-electron conjugated conductive macromolecule such as polyaniline or a derivative thereof, polypyrrole or a derivative thereof, polythiophene or a derivative thereof, or a copolymer of two or more kinds of these materials can be used.

The anode 702 and the cathode 704 can each be formed by a known method, for example, a sputtering method, a vacuum evaporation method, an ion plating method, a molecular beam epitaxy (MBE) method, a CVD method (a metal organic CVD (MOCVD) method or an atomic layer deposition (ALD) method), a sol-gel method, a spin coating method, a dipping method, a spray method, a coater method, or a printing method, depending on a material used.

There is no particular limitation on the stacked-layer structure of the EL layer 103. The EL layer 103 may be formed by appropriately combining functional layers such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. Note that such a stacked-layer structure is referred to as a light-emitting unit in some cases.

In this embodiment, a structure of the EL layer 103 which includes a hole-injection layer 711, a hole-transport layer 712, a light-emitting layer 713, an electron-transport layer 714, and an electron-injection layer 715 from the anode 702 side will be described (see FIG. 8A). A structure and a material of each layer will be specifically described below.

The hole-injection layer 711 is a layer which is provided in contact with the anode 702 and contains a substance with a high hole-injection property. As the substance having a high hole-injection property, for example, molybdenum oxide, vanadium oxide, ruthenium oxide, tungsten oxide, or manganese oxide can be used. Alternatively, any of the following may be used to form the hole-injection layer 711: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis[4-[bis(3-methylphenyl)amino]phenyl]-N,N'-diphenyl-[1,1'-biphenyl]-4,4'-diamine (abbreviation: DNTPD); a macromolecule such as poly(3,4-ethylenedioxythiophene)/poly(styrenesulfonate) (PEDOT/PSS), and the like.

Alternatively, for the hole-injection layer 711, a composite material in which a substance exhibiting an acceptor property with respect to a substance having a high hole-transport property is contained in the substance having a high hole-transport property may be used. Note that when a layer of the composite material in which an acceptor substance is contained in a substance having a high hole-transport property is formed in contact with the anode, a material for forming the anode can be selected regardless of its work function. In other words, it is possible to use, for the anode, a material with a low work function as well as a material with a high work function. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because they each have a high electron-accepting property. Among them, molybdenum oxide is especially preferable because it is stable in the air, has low hygroscopic property, and is easy to handle.

As the substance having a high hole-transport property used for the composite material, any of a variety of compounds such as an aromatic amine compound, a carbazole derivative, aromatic hydrocarbon, and a macromolecular compound (e.g., an oligomer, a dendrimer, or a polymer) can be used. An organic compound used for the composite material preferably has a high hole-transport property. Specifically, a substance having a hole mobility of $10^{-6}$ cm$^2$/Vs or higher is preferably used. However, any of substances other than the above materials may be used as long as the hole-transport property thereof is higher than the electron-transport property thereof Organic compounds which can be used for the composite material will be specifically given below.

As aromatic amine compounds, for example, the following can be given: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylpheny)amino]phenyl]-N,N'r-diphenyl-[1,1'-biphenyl]-4,4'-diamine (abbreviation: DNTPD), and 1,3,5-tris[N-(4-diphenylaminophenyl)-N-phenylamino]benzene (abbreviation: DPA3B).

As the carbazole derivative which can be used for the composite material, the following can be given specifically: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, as the carbazole derivative which can be used for the composite material, the following can also be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tent-butyl-9,10-di(2- naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis [2-(1-naphthyl)phenyl]anthracene, 9,10-bis [2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can also be given. It is particularly preferable to use the aromatic hydrocarbon which has a hole mobility of $1 \times 10^{-6}$ cm$^2$/Vs or higher and which has 14 to 42 carbon atoms.

The aromatic hydrocarbon which can be used for the composite material may. have a vinyl skeleton. As the aromatic hydrocarbon having a vinyl group, the following can be given for example: 4,4'-bis(2,2-diphenylvinyl)biphenyl (abbreviation: DPVBi) and 9,10-bis[4-(2,2-diphenylvinyl)phenyl]anthracene (abbreviation: DPVPA).

Moreover, a macromolecular compound such as poly(N-vinylcarbazole) (abbreviation: PVK), poly(4-vinyltriphenylamine) (abbreviation: PVTVA), poly[N-(4-{N'-[4-(4-diphenylamino)phenyl]phenyl-N-phenylamino}phenyl) methacrylamide](abbreviation: PTPDMA), or poly[N,N-bis(4-butylphenyl)-N,N-bis(phenyl)benzidine (abbreviation: poly-TPD) may be used.

Note that a layer formed using such a composite material can be very suitably used for optical design that is performed to control the light extraction efficiency, directivity, or the like of light emitted from the light-emitting layer because the driving voltage of the layer Ruined using the composite material hardly varies even when the layer is formed thick or thin.

The hole-transport layer 712 contains a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB), N,N-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The substances mentioned here are mainly ones each have a hole mobility of $10^{-6}$ cm$^2$/Vs or higher. However, any of substances other than the above materials may be used as long as the hole-transport property thereof is higher than the electron-transport property thereof. The layer containing a substance having a high hole-transport property is not limited to a single layer, and two or more layers containing any of the above substances may be stacked.

For the hole-transport layer 712, a macromolecular compound such as poly(N-vinylcarbazole) (abbreviation: PVK) or poly(4-vinyltriphenylamine) (abbreviation: PVTPA) may alternatively be used.

The light-emitting layer 713 is a layer containing a light-emitting substance. The light-emitting layer 713 may be either a light-emitting layer of a single film containing a luminescent center material as its main component or a so-called light-emitting layer of a host-guest type in which a luminescent center material is dispersed in a host material.

There is no particular limitation on the luminescent center material that is used, and a known fluorescent material or a known phosphorescent material can be used. As the fluorescent material, the following can be given, for example: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and other materials each having an emission wavelength of 450 nm or more, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N''-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tent-butyl-6-[2-(1,1,7,7-tetramethyl-2,3,6,7-tetrahydro-1H,5H-benzo [ij]quinolizin-9-yl)ethenyl]-4H-pyran-4-ylidene}propanedinitrile (abbreviation: DCJTB), 2-(2,6-bis{2[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As the phosphorescent material, the following can be given, for example: bis[2-(4',6'-difluorophenyl)pyridinato-N,C$^{2'}$]iridium(III) tetrakis(1-pyrazolyl)borate (abbreviation: FIr6), materials each having an emission wavelength in the range of 470 nm to 500 nm, such as bis[2-(4',6'-difluorophenyl)pyridinato-N,C$^{2'}$]iridium(III) picolinate (abbreviation: FIrpic), bis [2-(3',5'-bistrifluoromethylphenyl)pyridinato-N,C$^{2'}$]iridium (III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIracac), materials each having an emission wavelength of 500 nm or more (materials which emit green light), such as tris(2-phenylpyridinato)iridium(III) (abbreviation: Ir(ppy)$_3$), bis(2-phenylpyridinato) iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum (II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). Any of the above materials and other known materials may be selected in consideration of the emission color of each EL element.

When a host material is used, for example, any of the following can be used: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazoly)phenolato]zinc(II) (abbreviation: ZnBTZ), heterocyclic compounds such as 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11), and aromatic amine compounds such as NPB (or α-NPD), TPD, and BSPB. Alternatively, any of condensed polycyclic aromatic compounds such as anthracene derivatives, phenanthrene derivatives, pyrene derivatives, chrysene derivatives, and dibenzo[g,p]chrysene derivatives may be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N''',N''''-octaphenyldibenzo[g,p]chrysene-2,7,10,15-tetramine (abbreviation: DBC1), 9[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tent-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3). From these materials and other known materials, a material may be selected which, has a larger energy gap (or a triplet energy if the material emits phosphorescence) than a luminescent center material dispersed in the material and which has a transport property as needed.

The electron transport layer 714 contains a substance having a high electron-transport property. For example, a layer including a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like may be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tent-butylphenyl)-1,2,4-triazole (abbreviation: TAZ), bathophenanthroline (abbreviation: BPhen), bathocuproine (abbreviation: BCP), or the like may be used. The substances mentioned here are mainly ones each have an electron mobility of $10^{-6}$ cm$^2$/Vs or higher. However, any of substances other than the above materials may be used for the electron-transport layer 714 as long as the electron-transport property thereof is higher than the hole-transport property thereof.

The electron-transport layer 714 is not limited to a single layer, and two or more layers containing any of the above substances may be stacked.

Further, a layer for controlling transport of electrons may be provided between the electron-transport layer 714 and the light-emitting layer 713. Specifically, the layer for controlling transport of electrons is a layer formed by adding a small amount of substance having a high electron trapping property to the above material having a high electron-transport property, and is capable of adjusting carrier balance by suppressing transport of electrons. Such a structure is very effective in suppressing occurrence of a problem (such as shortening of the life of an element) due to electrons passing through the light-emitting layer 713.

For the electron-injection layer 715, an alkali metal, an alkaline earth metal, or a compound thereof, such as lithium fluoride (LiF), cesium fluoride (CsF), or calcium fluoride (CaF$_2$) can be used. Alternatively, a material in which a layer formed using a substance exhibiting an electron-transport property includes a substance exhibiting an electron-donating property (typically, an alkali metal, an alkaline earth metal, or a compound thereof) with respect to the substance exhibiting an electron-transport property (the material having a donor level), for example, a material in which Alq contains magnesium (Mg) can be used for the electron-injection layer 715. Note that the use of the material having a donor level for the electron-injection layer 715 is preferable because electron injection from the cathode 704 is effectively performed.

Figure 8A:
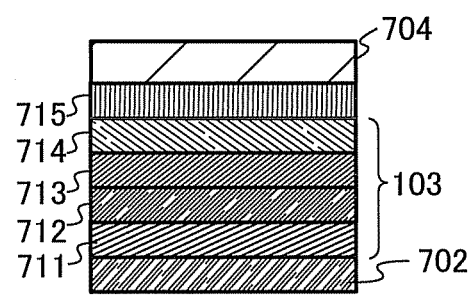
FIGS. 8A and 8B each illustrate a structure of an EL element.
Figure 8B:
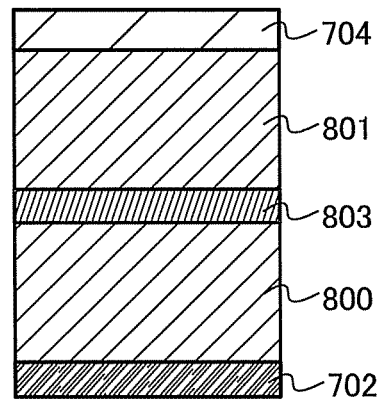

Note that the EL layer 103 may have a structure where a plurality of light-emitting units is stacked between the anode 702 and the cathode 704 as illustrated in FIG. 8B. In this case, a charge-generation layer 803 is preferably provided between a first light-emitting unit 800 and a second light-emitting unit 801 which are stacked. The charge-generation layer 803 can be formed with the use of the above composite material. Further, the charge-generation layer 803 may have a layered structure including a layer containing the composite material and a layer containing another material. In this case, as the layer containing another material, a layer containing an electron donating substance and a substance with a high electron-transport property, a layer formed using a transparent conductive film, or the like can be used. An EL element having such a structure is less likely to involve problems such as energy transfer between the light-emitting units and quenching and has more choices of materials, thereby readily having both high light emission efficiency and a long life. It is also easy for such an EL element to exhibit phosphorescence from one of the light-emitting units and fluorescence from the other. Although FIG. 8B illustrates a structure in which two light-emitting units (the first light-emitting unit 800 and the second light-emitting unit 801) are stacked, three or more light-emitting units may be stacked. In such a case, charge-generation layers are preferably provided between the light-emitting units.

The light-emitting unit has a structure similar to the structure of the EL layer 103 in FIG. 8A, and may be formed by combining functional layers described as components of the EL layer in FIG. 8A as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. The detailed description of these layers is given above and thus a repeated description thereof is omitted. The description of the EL layer 103 in FIG. 8A can be referred to.

The structure illustrated in FIG. 8B is particularly preferable for obtaining white light emission, and thus is effective particularly for lighting application. Accordingly, a high-quality light-emitting device can be provided.

(Embodiment 5)

In this embodiment, an example of a top-emission lighting device in which the light-emitting device described in any of the above embodiments is used will be described with reference to FIGS. 9A and 9B.

Figure 9A:
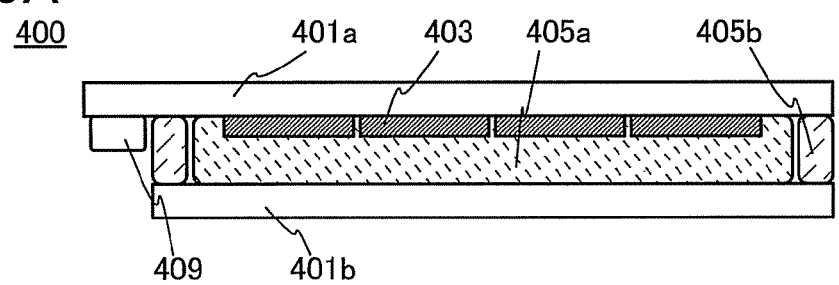
FIGS. 9A and 9B each illustrate a light-emitting device according to an embodiment of the present invention.

In a lighting device 400 illustrated in FIG. 9A, a plurality of light-emitting devices 403 is formed on a first substrate 401a. The first substrate 401a and a second substrate 401b having a light-transmitting property, which face each other, are attached to each other with a sealant 405a covering the light-emitting devices 403 and a sealant 405b provided at an end portion of the substrates.

Any of the light-emitting devices described in the above embodiments can be used as each of the light-emitting devices 403 as appropriate.

It is preferable that a substrate having high thermal conductivity, such as a metal substrate, be used as the first substrate 401a. In the case of a large lighting device including an EL element, heat from the EL element becomes a problem in some cases; therefore, heat dissipation can be increased with the use of such a substrate having high thermal conductivity. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

A light-transmitting substrate is used as the second substrate 401b. Uneven structures may be provided on a surface intersecting with light emitted from the light-emitting device 403, such as a surface of the light-emitting device 403 or top and bottom surfaces of the second substrate 401b in order to prevent total reflection. For example, a hemispherical lens, a microlens array, a film provided with an uneven structure, a light diffusing film, or the like may be attached, or an uneven structure may be directly formed.

As each of the sealants 405a and 405b, a material which can attach facing surfaces to each other can be used. For example, a known sealant formed of a thermosetting material, an ultraviolet curable material, or the like can be used. In particular, a light-transmitting material is preferably used for the sealant 405a. A material used for these is desirably a material which transmits moisture or oxygen as little as possible. In addition, a sealant containing a desiccating agent can also be used.

Figure 9B:
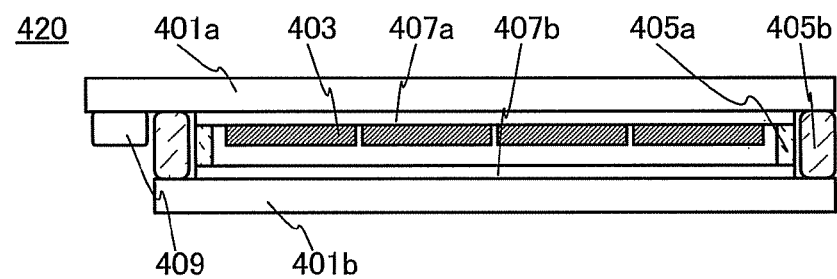

In a lighting device 420 illustrated in FIG. 9B, a structure in which a plurality of the light-emitting devices 403 formed on a first glass layer 407a is sealed with a second glass layer 407b is surrounded by the first substrate 401a and the second substrate 401b.

The first glass layer 407a and the second glass layer 407b are attached to each other with the sealant 405a. The first substrate 401a and the second substrate 401b are attached to each other with the sealant 405b.

Further, a space between the first glass layer 407a and the second glass layer 407b may be filled with a filler such as an inert gas (e.g., nitrogen or argon) or a sealant having a light-transmitting property.

Since the light-emitting devices 403 are sealed between two thin glass layers in the lighting device 420, an impurity such as moisture or oxygen can be prevented from entering from the outside, and thus, a highly reliable lighting device can be provided.

Further, each of the lighting devices 400 and 420 is provided with a converter 409, which is connected to the light-emitting devices 403, on the first substrate 401a. The converter 409 converts, for example, power supply voltage for home use into power supply voltage for driving the lighting device. Note that the converter 409 may be formed more on the inside than the sealant 405b.

Further, a material having flexibility, such as plastics, an organic resin film, a thin glass substrate, or a metal thin film, is used as a material of the substrates used for the lighting devices 400 and 420, whereby the lighting device can be light'and flexible.

Note that although a top-emission lighting device is described in this embodiment, in the case of a bottom-emission lighting device, for example, a substrate for which a light-emitting device is provided is preferably a light-transmitting substrate.

This embodiment can be combined with any of the other embodiments disclosed in this specification as appropriate.

(Embodiment 6)

In this embodiment, lighting devices each including a light-emitting device manufactured according to an embodiment of the present invention will be described with reference to FIG. 10 and FIG. 11.

Figure 10:
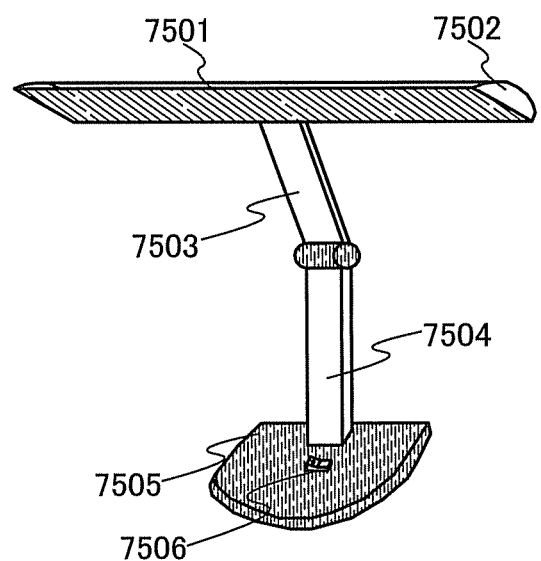
FIG. 10 illustrates a lighting device according to an embodiment of the present invention.

FIG. 10 illustrates a lighting device (desk lamp), which includes a lighting portion 7501, a shade 7502, an adjustable arm 7503, a support 7504, a base 7505, and a power switch 7506. Note that the lighting device is manufactured using a light-emitting device, which is manufactured according to an embodiment of the present invention, for the lighting portion 7501. Note that the term "lighting device" also encompasses ceiling lights (ceiling-fixed lighting devices), wall lights (wall-hanging lighting devices), and the like, as well as the desk lamp illustrated in FIG. 10.

A lighting device according to an embodiment of the present invention is a lighting device with high reliability and a high manufacturing yield. Therefore, such a lighting device is used for the lighting portion 7501 of the lighting device (desk lamp 3000), a price-competitive lighting device (desk lamp) having high reliability can be provided. Further, a lighting device according to an embodiment of the present invention can have low power consumption.

Figure 11:
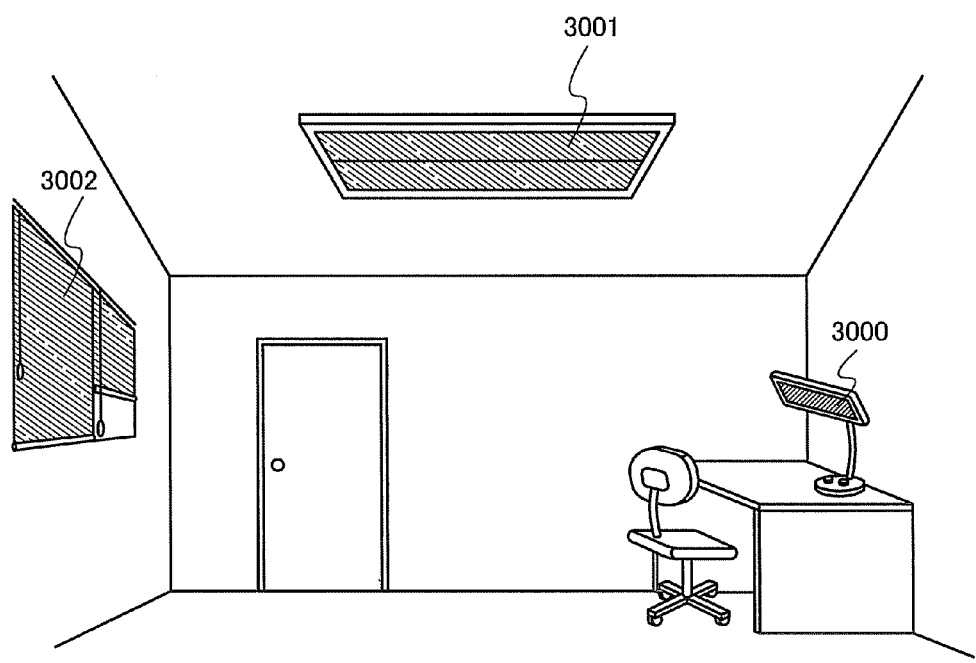
FIG. 11 illustrates lighting devices according to embodiments of the present invention.

FIG. 11 illustrates an example in which a light-emitting device according to an embodiment of the present invention is used for a room lighting device. Since the light-emitting device according to an embodiment of the present invention is a lighting device with high reliability and a high manufacturing yield, the light-emitting device can be preferably used for a large-area lighting device such as a ceiling light 3001. In addition, the light-emitting device can be used for a wall lighting device 3002. A lighting device according to an embodiment of the present invention can have low power consumption.

This application is based on Japanese Patent Application serial no. 2011-045541 filed with Japan Patent Office on Mar. 2, 2011, the entire contents of which are hereby incorporated by reference.

What is claimed is:

1. A light-emitting device comprising:
 a light-emitting element formed over an insulating surface of a substrate, the light-emitting element comprising:
  a first electrode on the insulating surface;
  a second electrode which faces the first electrode; and
  an organic compound layer containing a light-emitting substance between the first electrode and the second electrode,
  wherein a light-emitting region is formed in a portion where the first electrode is in contact with the organic compound layer;
 a conductive layer which is electrically isolated from the first electrode over the insulating surface; and
 a separation layer with a protruding portion which protrudes outside more than a bottom portion of the separation layer along a side of the light-emitting region, wherein the separation layer is provided on the conductive layer,
 wherein the organic compound layer and the second electrode in the light-emitting region extend to a space under the protruding portion of the separation layer and the second electrode extends more on the inside of an outline of the protruding portion than the organic compound layer, so that the second electrode is electrically connected to the conductive layer, and
 wherein the outline of the protruding portion has depressions when seen from top of the insulating surface of the substrate.

2. The light-emitting device according to claim 1, wherein the second electrode is formed using a light-transmitting material.

3. The light-emitting device according to claim 1, wherein the conductive layer is formed using a same material as the first electrode.

4. The light-emitting device according to claim 1, wherein the outline of the protruding portion has a comb-like shape when seen from top of the insulating surface of the substrate.

5. A lighting device comprising the light-emitting device according to claim 1.

6. A light-emitting device comprising:
 a first light-emitting element over an insulating surface of a substrate, the first light-emitting element comprising:
  a first electrode on the insulating surface;
  a second electrode which faces the first electrode; and
  an organic compound layer containing a light-emitting substance between the first electrode and the second electrode,
 a second light-emitting element over the insulating surface, the second light-emitting element comprising:
  a third electrode on the insulating surface;
  a fourth electrode which faces the third electrode; and
  an organic compound layer containing a light-emitting substance between the third electrode and the fourth electrode;
 a wiring which is electrically connected to the third electrode; and
 a separation layer in a region between the first light-emitting element and the second light-emitting element, wherein the separation layer is provided on the wiring,
 wherein the separation layer comprises a protruding portion which protrudes outside more than a bottom portion of the separation layer,
 wherein the organic compound layer and the second electrode of the first light-emitting element extend to a space under the protruding portion of the separation layer and the second electrode extends more on the inside of an outline of the protruding portion than the organic compound layer, so that the second electrode is in contact with the wiring,
 wherein the outline of the protruding portion has depressions which are depressed in a short direction of the separation layer when seen from top of the insulating surface of the substrate.

7. The light-emitting device according to claim 6, further comprising an insulating layer provided on the wiring, wherein the insulating layer overlaps with the outline of the protruding portion, and wherein the insulating layer is provided between the separation layer and the second light-emitting element.

8. The light-emitting device according to claim 6, wherein the second electrode and the fourth electrode are each formed using a light-transmitting material.

9. The light-emitting device according to claim 6, wherein the wiring is connected to the third electrode.

10. The light-emitting device according to claim 6, wherein the outline of the protruding portion has a comb-like shape when seen from top of the insulating surface of the substrate.

11. A lighting device comprising the light-emitting device according to claim 6.

* * * * *

UNITED STATES PATENT AND TRADEMARK OFFICE
CERTIFICATE OF CORRECTION

PATENT NO. : 8,928,011 B2
APPLICATION NO. : 13/409814
DATED : January 6, 2015
INVENTOR(S) : Yoshifumi Tanada and Hidenori Mori It is certified that error appears in the above-identified patent and that said Letters Patent is hereby corrected as shown below:

In the Specification:

Column 11, Line 17; Change "foamed" to --formed--.

Column 16, Line 36; Change "fowled" to --formed--.

Column 21, Line 67; Change "foamed" to --formed--.

Column 24, Lines 47 to 49; Change "N,N'-bis[4-[bis(3-methylpheny)amino]phenyl]-N,N'r-diphenyl-[1,1'-biphenyl]-4,4'-diamine (abbreviation: DNTPD),"
to --N,N'-bis[4-[bis(3-methylphenyl)amino]phenyl]-N,N'-diphenyl-[1,1'-biphenyl]-4,4'-diamine (abbreviation: DNTPD),--.

Column 24, Line 67; Change "2-tent-butyl" to --2-tert-butyl--.

Column 25, Line 30; Change "PVTVA)," to --PVTPA),--.

Column 25, Lines 30 to 32; Change "poly[N-(4-{N'-[4-(4-diphenylamino)phenyl]phenyl-N-phenylamino}phenyl)methacrylamide] (abbreviation: PTPDMA),"
to --poly[N-(4-{N'-[4-(4-diphenylamino)phenyl]phenyl-N'-phenylamino}phenyl)methacrylamide] (abbreviation: PTPDMA),--.

Column 25, Lines 32 to 34; Change "poly[N,N-bis(4-butylphenyl)-N,N-bis(phenyl)benzidine (abbreviation: poly-TPD)"
to --poly[N,N'-bis(4-butylphenyl)-N,N'-bis(phenyl)benzidine (abbreviation: poly-TPD)--.

Signed and Sealed this
Nineteenth Day of May, 2015

Michelle K. Lee
*Director of the United States Patent and Trademark Office*

CERTIFICATE OF CORRECTION (continued)
U.S. Pat. No. 8,928,011 B2

Column 25, Line 39; Change "Ruined" to --formed--.

Column 25, Line 46 to 47; Change "N,N-bis(3-methylphenyl)-N,N'-diphenyl-[1,1'-biphenyl]-4,4'-diamine (abbreviation: TPD)," to --N,N'-bis(3-methylphenyl)-N,N'-diphenyl-[1,1'-biphenyl]-4,4'-diamine (abbreviation: TPD),--.

Column 26, Lines 17 to 19; Change "N,N"-(2-tert-butylanthracene-9,10-diyldi-4,1-phenylene)bis[N,N',N"-triphenyl-1,4-phenylenediamine] (abbreviation: DPABPA)," to --N,N"-(2-tert-butylanthracene-9,10-diyldi-4,1-phenylene)bis[N,N',N'-triphenyl-1,4-phenylenediamine] (abbreviation: DPABPA),--.

Column 26, Line 49; Change "2-tent" to --2-tert--.

Column 27, Line 37; Change "benzothiazoly)" to --benzothiazolyl)--.

Column 27, Line 38; Change "4-tent" to --4-tert--.

Column 27, Lines 60 to 62; Change "N,9-diphenyl-N-{4-4-[4-(10-phenyl-9-anthryl)phenyl]phenyl}-9H-carbazol-3-amine (abbreviation: PCAPBA)," to --N,9-diphenyl-N-{4-[4-(10-phenyl-9-anthryl)phenyl]phenyl}-9H-carbazol-3-amine (abbreviation: PCAPBA),--.

Column 28, Line 4; Change "2-tent-butyl" to --2-tert-butyl--.

Column 28, Line 32; Change "(4-tent" to --(4-tert--.

Column 30, Line 59; Change "light' and" to --light and--.